United States Patent
Yun

(10) Patent No.: US 11,011,578 B2
(45) Date of Patent: May 18, 2021

(54) RESISTIVE MEMORY DEVICE

(71) Applicant: SAMSUNG ELECTRONICS CO., LTD., Suwon-si (KR)

(72) Inventor: Jin-chan Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/367,954

(22) Filed: Mar. 28, 2019

(65) Prior Publication Data

US 2020/0066796 A1 Feb. 27, 2020

(30) Foreign Application Priority Data

Aug. 23, 2018 (KR) .................. 10-2018-0098761

(51) Int. Cl.
*H01L 27/24* (2006.01)
*G11C 13/00* (2006.01)
(Continued)

(52) U.S. Cl.
CPC ........ *H01L 27/2463* (2013.01); *G11C 13/003* (2013.01); *G11C 13/0004* (2013.01);
(Continued)

(58) Field of Classification Search
CPC . H01L 27/2463; H01L 27/2409; H01L 45/06; H01L 45/126; H01L 45/144;
(Continued)

(56) References Cited

U.S. PATENT DOCUMENTS 6,795,338 B2  9/2004 Parkinson et al.
7,589,343 B2  9/2009 Lowrey
(Continued)

FOREIGN PATENT DOCUMENTS

KR   10-2010-0050109   5/2010
KR   10-1171874        8/2012
KR   10-1776858        9/2017

OTHER PUBLICATIONS

Kang et al., "PRAM cell technology and characterization in 20nm node size", New Memory Lab., Process Development Team, Computer Aided Engineering Team, Semiconductor Research Center, Samsung Electronics Co. Ltd., IEEE, 2011, pp. 39-42.
(Continued)

*Primary Examiner* — Galina G Yushina
(74) *Attorney, Agent, or Firm* — F. Chau & Associates, LLC

(57) ABSTRACT

A resistive memory device including: first conductive lines extending in a first direction; second conductive lines extending in a second direction crossing the first direction; and memory cells connected to the first conductive lines and the second conductive lines, wherein the memory cells include: a first memory cell including a first resistive memory layer and a first heating electrode layer, the first heating electrode layer includes a first contact surface in contact with the first resistive memory layer and the first contact surface has a first contact resistance; and a second memory cell including a second resistive memory layer and a second heating electrode layer, the second heating electrode layer includes a second contact surface in contact with
(Continued)

the second resistive memory layer and the second contact surface has a second contact resistance different from the first contact resistance.

19 Claims, 29 Drawing Sheets

(51) Int. Cl.
*H01L 45/00* (2006.01)
*G11C 11/56* (2006.01)

(52) U.S. Cl.
CPC .......... *H01L 27/2409* (2013.01); *H01L 45/06* (2013.01); *H01L 45/126* (2013.01); *H01L 45/1675* (2013.01); *G11C 11/5678* (2013.01); *G11C 13/004* (2013.01); *G11C 13/0026* (2013.01); *G11C 13/0028* (2013.01); *G11C 13/0038* (2013.01); *G11C 13/0069* (2013.01); *G11C 2213/72* (2013.01); *H01L 45/144* (2013.01)

(58) Field of Classification Search
CPC . H01L 45/12; H01L 45/04; H01L 2924/1435; H01L 2924/1434; G11C 13/003; G11C 13/004; G11C 2213/72; G11C 11/5678; G11C 13/0028; G11C 2213/52; G11C 2013/0095; G11C 14/0045; G11C 14/009
See application file for complete search history.

(56) References Cited

U.S. PATENT DOCUMENTS

| | | | |
|---|---|---|---|
| 8,379,439 B2 | 2/2013 | Lowrey et al. | |
| 8,436,331 B2 | 5/2013 | Iwakaji et al. | |
| 8,565,039 B2 | 10/2013 | Lambertson et al. | |
| 9,276,202 B2 | 3/2016 | Song et al. | |
| 9,478,281 B2 | 10/2016 | Son | |
| 2009/0250679 A1* | 10/2009 | Jung | H01L 27/2463 257/2 |
| 2012/0044738 A1* | 2/2012 | Chung | G11C 8/14 365/96 |
| 2013/0148406 A1* | 6/2013 | Shimakawa | G11C 11/1673 365/148 |
| 2013/0187112 A1* | 7/2013 | Kuniya | H01L 27/2409 257/2 |
| 2017/0271592 A1* | 9/2017 | Lee | H01L 27/2427 |
| 2018/0375023 A1* | 12/2018 | Song | H01L 27/2463 |
| 2019/0006422 A1* | 1/2019 | Park | G11C 13/0004 |
| 2019/0067570 A1* | 2/2019 | Tsai | H01L 27/2436 |

OTHER PUBLICATIONS

Zhao et al., "Study of Geometric Effect on Phase Change Random Access Memory", Data Storage Institute, IEEE, 2005, pp. 110-114.

* cited by examiner

RESISTIVE MEMORY DEVICE

CROSS-REFERENCE TO RELATED APPLICATION

This application claims priority under 35 U.S.C. § 119 to Korean Patent Application No. 10-2018-0098761, filed on Aug. 23, 2018, in the Korean Intellectual Property Office, the disclosure of which is incorporated by reference herein in its entirety.

TECHNICAL FIELD

The inventive concept relates to a memory device, and more particularly, to a resistive memory device having a cross-point array.

DISCUSSION OF RELATED ART

A resistive memory device is a type of nonvolatile memory device that has a three-dimensional cross-point stacked structure in which a memory cell is arranged at an intersection between two electrodes crossing each other. A voltage drop (also referred to as "an IR drop") may occur in a current flow path of a memory cell array of the resistive memory device. As the speed and capacity of the resistive memory device continues to increase, the reliability of the resistive memory device may be reduced by an IR drop.

SUMMARY

According to an exemplary embodiment of the inventive concept, there is provided a resistive memory device including: a plurality of first conductive lines extending in a first direction; a plurality of second conductive lines extending in a second direction crossing the first direction; and a plurality of memory cells connected to the plurality of first conductive lines and the plurality of second conductive lines, wherein the plurality of memory cells comprise: a first memory cell comprising a first resistive memory layer and a first heating electrode layer, the first heating electrode layer comprises a first contact surface in contact with the first resistive memory layer and the first contact surface has a first contact resistance; and a second memory cell comprising a second resistive memory layer and a second heating electrode layer, the second heating electrode layer comprises a second contact surface in contact with the second resistive memory layer and the second contact surface has a second contact resistance different from the first contact resistance.

According to an exemplary embodiment of the inventive concept, there is provided a resistive memory device including: a first conductive line comprising an access point to which a voltage is applied; and a plurality of memory cells connected to the first conductive line, wherein the plurality of memory cells comprise: a first memory cell arranged at a first distance from the access point, the first memory cell comprising a first resistive memory layer and a first heating electrode layer, the first heating electrode layer comprises a first contact surface in contact with the first resistive memory layer and the first contact surface has a first contact resistance; and a second memory cell arranged at a second distance greater than the first distance from the access point, the second memory cell comprising a second resistive memory layer and a second heating electrode layer, the second heating electrode layer comprises a second contact surface in contact with the second resistive memory layer and the second contact surface has a second contact resistance different from the first contact resistance.

According to an exemplary embodiment of the inventive concept, there is provided a resistive memory device including: a plurality of first conductive lines extending in a first direction in a first region and a second region, the first region and the second region being spaced apart from each other on a substrate; a plurality of second conductive lines extending in a second direction in the first region and the second region, the second direction crossing the first direction; and a plurality of memory cells connected to the first conductive lines and the second conductive lines in the first region and the second region, wherein the plurality of memory cells comprise: a first memory cell comprising a first heating electrode layer arranged in the first region and having a first resistance; and a second memory cell comprising a second heating electrode layer arranged in the second region and having a second resistance greater than the first resistance.

According to an exemplary embodiment of the inventive concept, there is provided a resistive memory device including: a plurality of wordlines extended in a first direction; a plurality of bitlines extended in a second direction crossing the first direction; a first memory cell connected to a first wordline and a first bitline; and a second memory cell connected to the first wordline and a second bitline, wherein the first memory cell is disposed closer to an access point of the first wordline than the second memory cell, the first memory cell including a first heating layer in direct contact with a first resistive material layer, the second memory cell including a second heating layer in direct contact with a second resistive material layer, and wherein a greater contact resistance is provided between the second heating layer and the second resistive material layer than between the first heating layer and the first resistive material layer.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
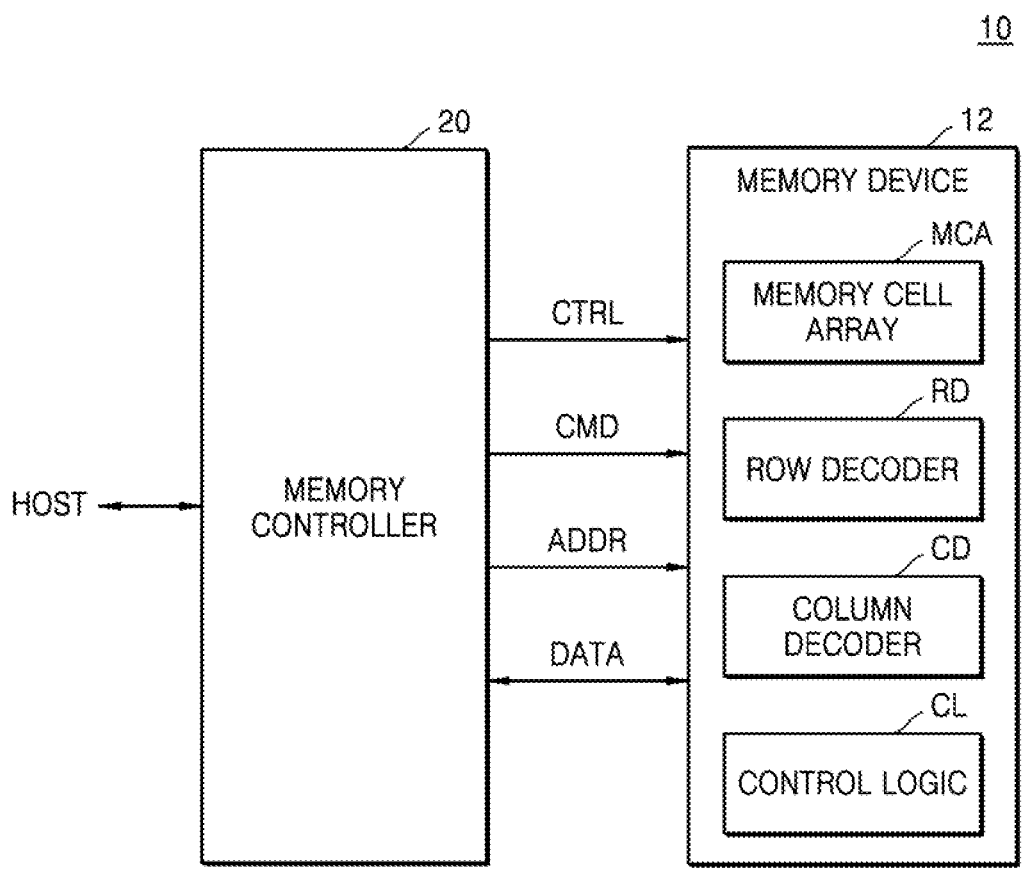
FIG. 1 is a block diagram illustrating a memory system including a resistive memory device according to an exemplary embodiment of the inventive concept.

Hereinafter, exemplary embodiments of the present inventive concept will be described in detail with reference to the accompanying drawings. In the accompanying drawings, dimensions of constituent elements may be exaggerated or reduced for clear understanding of the inventive concept. In the accompanying drawings, identical reference numerals may be used for the same constituent elements and a duplicate description thereof may be omitted.

FIG. 1 is a block diagram illustrating a memory system 10 including a resistive memory device according to an exemplary embodiment of the inventive concept.

Referring to FIG. 1, the memory system 10 may include a memory device 12 and a memory controller 20. The memory device 12 may include a memory cell array MCA, a row decoder RD, a column decoder CD, and a control logic CL.

The memory controller 20 may control the memory device 12 to read data DATA stored in the memory device 12 or to write data DATA to the memory device 12 in response to a write/read request from a host HOST. The memory controller 20 may control a program (or write) operation, a read operation, and an erase operation for the memory device 12 by providing an address ADDR, a command CMD, and a control signal CTRL to the memory device 12. In addition, data DATA to be written and data DATA to be read may be transmitted and received between the memory controller 20 and the memory device 12.

The memory cell array MCA may include a plurality of memory cells arranged respectively in regions where a plurality of first signal lines and a plurality of second signal lines cross each other. For example, the memory cell array MCA may include a plurality of memory cells MC illustrated in FIG. 3. In exemplary embodiments of the inventive concept, the plurality of first signal lines may be a plurality of bit lines, and the plurality of second signal lines may be a plurality of word lines. In other exemplary embodiments of the inventive concept, the plurality of first signal lines may be a plurality of word lines, and the plurality of second signal lines may be a plurality of bit lines.

The plurality of memory cells may each include a single level cell (SLC) storing one bit, a multi level cell (MLC) capable of storing data of at least two bits, or a combination thereof.

Figure 3:
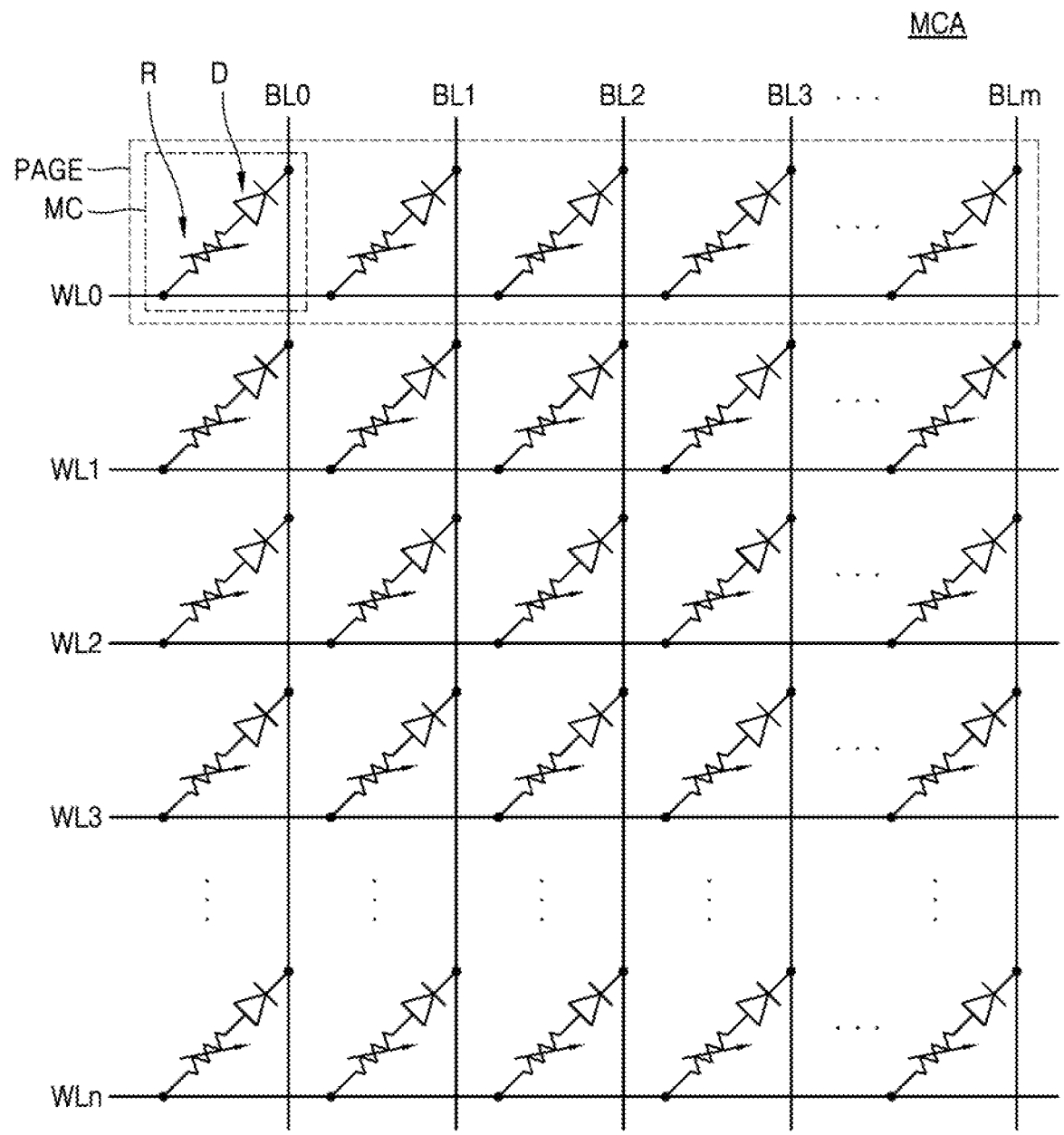
FIG. 3 is a circuit diagram illustrating a memory cell array of a resistive memory device according to an exemplary embodiment of the inventive concept.

The memory cell array MCA may include resistive memory cells including variable resistive elements (for example, a variable resistor R illustrated in FIG. 3). In exemplary embodiments of the inventive concept, when the variable resistive element includes a phase change material whose resistance varies with temperature, the memory device 12 may be a phase-change random-access memory (PRAM) device.

The row decoder RD may drive the plurality of word lines in the memory cell array MCA and the column decoder CD may drive the plurality of bit lines in the memory cell array MCA. The row decoder RD may include a decoding unit for decoding a row address and a switch unit for controlling switching in response to various row control signals according to a decoding result. The column decoder CD may include a decoding unit for decoding a column address and a switch unit for controlling switching in response to various column control signals according to a decoding result.

The control logic CL may control the overall operation of the memory device 12, and control the row decoder RD and the column decoder CD to perform an operation of selecting the memory cell in the memory cell array MCA. For example, the control logic CL may process the address ADDR received from the outside and generate the row address and the column address. The memory device 12 may include a power supply unit for generating various write voltages and read voltages used in write and read operations. The write voltages and the read voltages may be provided to the memory cell via the row decoder RD and the column decoder CD under the control of the control logic CL.

Figure 2:
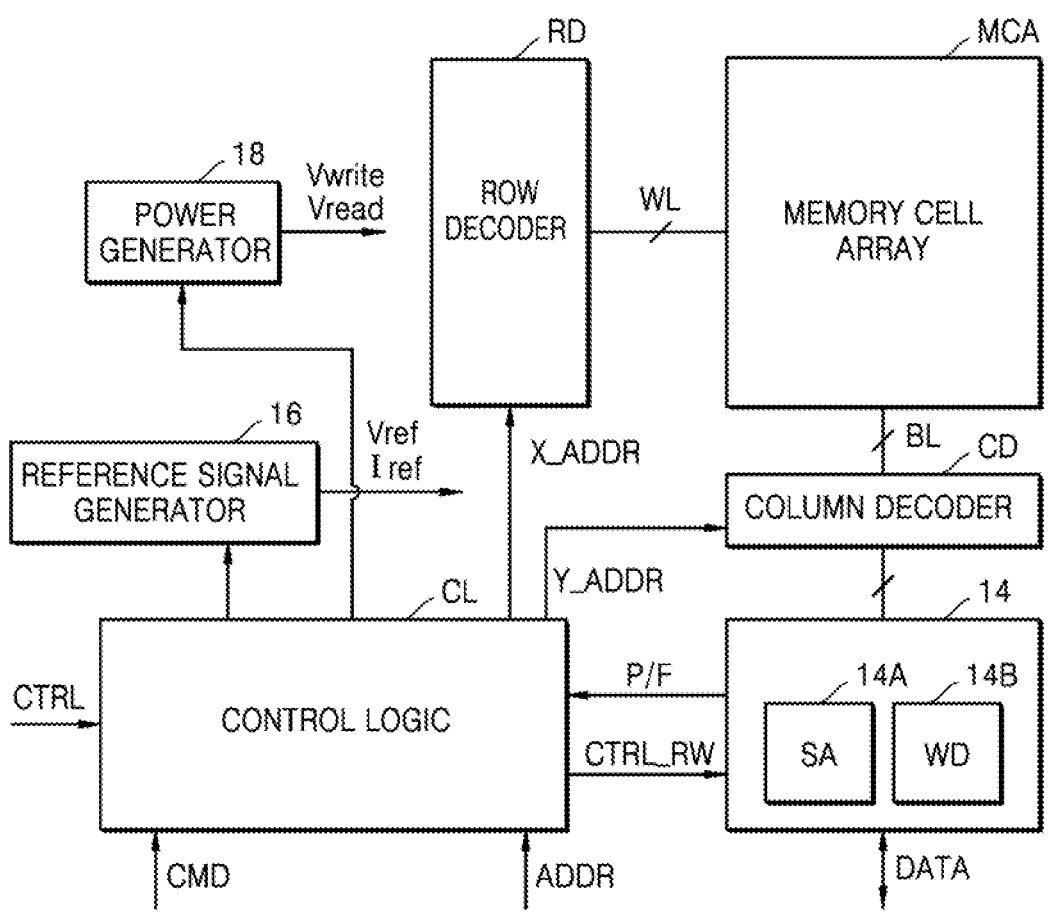
FIG. 2 is a block diagram illustrating a configuration of a resistive memory device according to an exemplary embodiment of the inventive concept.

FIG. 2 is a block diagram for explaining an example configuration of the memory device 12 illustrated in FIG. 1.

Referring to FIG. 2, the memory device 12 may include the memory cell array MCA, the row decoder RD, the column decoder CD, and the control logic CL. In addition, the memory device 12 may fluffier include a write/read circuit 14, a reference signal generator 16, and a power generator 18. The write/read circuit 14 may include a sense amplifier 14A and a write driver 14B.

The plurality of memory cells in the memory cell array MCA may be connected to a plurality of word lines WL and a plurality of bit lines BL. As various voltage signals or current signals are provided via the plurality of word lines WL and the plurality of hit lines BL, data may be written to or read from selected memory cells, and write or read operations for unselected memory cells are prevented.

The address ADDR for indicating a memory cell to be accessed along with the command CMD may be received by the control logic CL. The address ADDR may include a row address X_ADDR for selecting the word line WL of the memory cell array MCA and a column address Y_ADDR for selecting the bit line BL of the memory cell array MCA. The row decoder RD may perform a word line selection operation in response to the row address X_ADDR, and the column decoder CD may perform a bit line selection operation in response to the column address Y_ADDR.

The write/read circuit 14 may be connected to the bit line BL to write data to the memory cell or to read data from the memory cell.

The power generator 18 may generate a write voltage Vwrite used for the write operation and a read voltage Vread used for the read operation. The write voltage Vwrite may include a set voltage and a reset voltage. The write voltage Vwrite and the read voltage Vread may be provided to the bit lines BL via the column decoder CD or to the word lines WL via the row decoder RD, respectively.

The reference signal generator 16 may generate a reference voltage Vref and a reference current Iref as various reference signals related to a data read operation.

In the write/read circuit 14, the sense amplifier 14A may be connected to a sensing node of the bit line BL to read data based on the reference voltage Vref or the reference current Iref. The write/read circuit 14 may provide to the control logic CL a pass/fail signal P/F according to a differentiation result of the read data. The control logic CL may control the write and read operations of the memory cell array MCA by referring to the pass/fail signal P/F.

The control logic CL may generate various control signals CTRL_RW for reading data from the memory cell array MCA or for writing data to the memory cell array MCA, based on the address ADDR, the command CMD, and the control signal CTRL received from the memory controller 20 (refer to FIG. 1).

FIG. 3 is a circuit diagram of the memory cell array MCA illustrated in FIG. 2, according to an exemplary embodiment of the inventive concept.

Referring to FIG. 3, the memory cell array MCA may include a plurality of cell regions, and one cell region among the plurality of cell regions is represented.

The memory cell array MCA may include $0^{th}$ through $n^{th}$ word lines WL0, WL1, ..., WLn, $0^{th}$ through $m^{th}$ bit lines BL0, BL1, ..., BLm, and the plurality of memory cells MC. The $0^{th}$ through $n^{th}$ word lines WL0, WL1, ..., WLn may correspond to the word lines WL in FIG. 2, and the $0^{th}$ through $m^{th}$ bit lines BL0, BL1, ..., BLm may correspond to the bit lines BL in FIG. 2. The plurality of memory cells MC may each be arranged at one of intersections of the $0^{th}$ through $n^{th}$ word lines WL0, WL1, ..., WLn and the $0^{th}$ through $m^{th}$ bit lines BL0, BL1, ..., BLm. The number of word lines WL, the number of bit lines BL, and the number of memory cells MC may be variously changed according to an exemplary embodiment of the inventive concept. The plurality of memory cells MC connected to one of the $0^{th}$ through $n^{th}$ word lines WL0, WL1, ..., WLn may be defined in page PAGE units. For example, one PAGE unit may include all of the memory cells MC connected to the word line WL0.

The plurality of memory cells MC may each include the variable resistor R for storing information and a selection device D for selecting the memory cell MC. The selection device D may be electrically connected to one word line of the $0^{th}$ through $n^{th}$ word lines WL0, WL1, ..., WLn, the variable resistor R may be electrically connected to one bit line of the $0^{th}$ through $m^{th}$ bit lines BL0, BL1, ..., BLm, and the variable resistor R and the selection device D may be connected to each other in series. However, the inventive concept is not limited thereto, and the variable resistor R may be connected to one of the $0^{th}$ through $n^{th}$ word lines WL0, WL1, ..., WLn, and the selection device D may be connected to one of the $0^{th}$ through $m^{th}$ bit lines BL0, BL1, ..., BLm.

To drive the memory device 12 (refer to FIG. 2), a voltage may be applied to the variable resistor R of the memory cell MC via the $0^{th}$ through $n^{th}$ word lines WL0, WL1, ..., WLn and the $0^{th}$ through $m^{th}$ bit lines BL0, BL1, .... BLm so that current flows in the variable resistor R. The variable resistor R may be changed to one of a plurality of resistance states due to an applied electrical pulse. In exemplary embodiments of the inventive concept, the variable resistor R may include a phase-change material in which a crystal state changes according to an amount of current applied thereto. The phase-change material may be changed to an amorphous state of a relatively high resistance or a crystal state of a relatively low resistance. A phase of the phase-change material may be changed by Joule's heat generated according to the amount of current applied thereto, and data may be written by using such phase-change.

Any memory cell MC may be addressed by selection of the $0^{th}$ through $n^{th}$ word lines WL0, WL1, ..., MLn and the $0^{th}$ through $m^{th}$ bit lines BL0, BL1, ..., BLm, and may be programmed by applying a signal between the selected word line and the selected bit line. By measuring a value of current flowing through the $0^{th}$ through $m^{th}$ bit lines BL0, BL1, ..., BLm, information according to a resistance value of a resistive memory layer of the corresponding memory cell MC, in other words, programmed information, may be read.

Figure 4A:
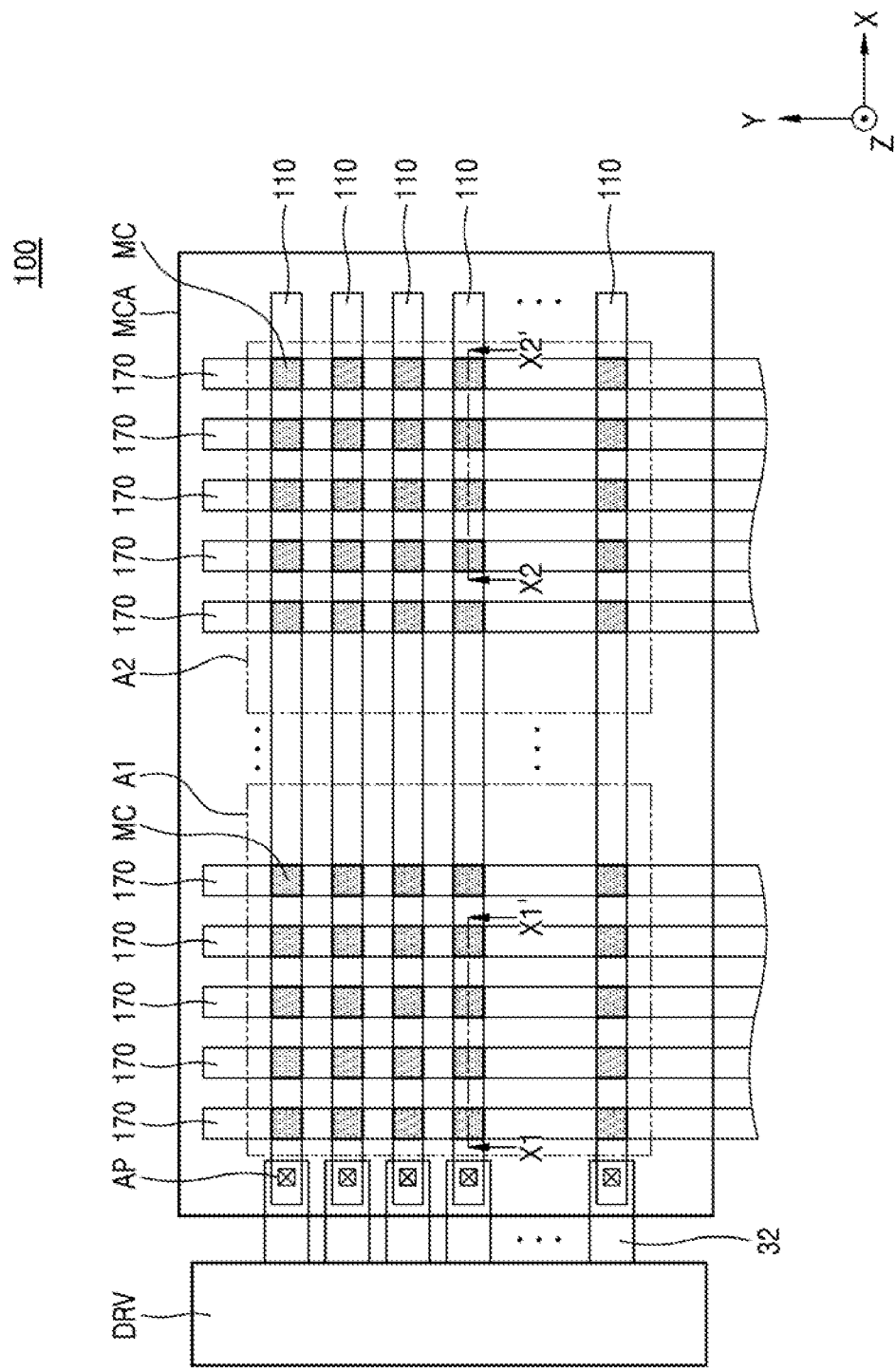
FIG. 4A is a plan layout diagram schematically illustrating a partial configuration of a memory device according to exemplary embodiments of the inventive concept.
Figure 4B:
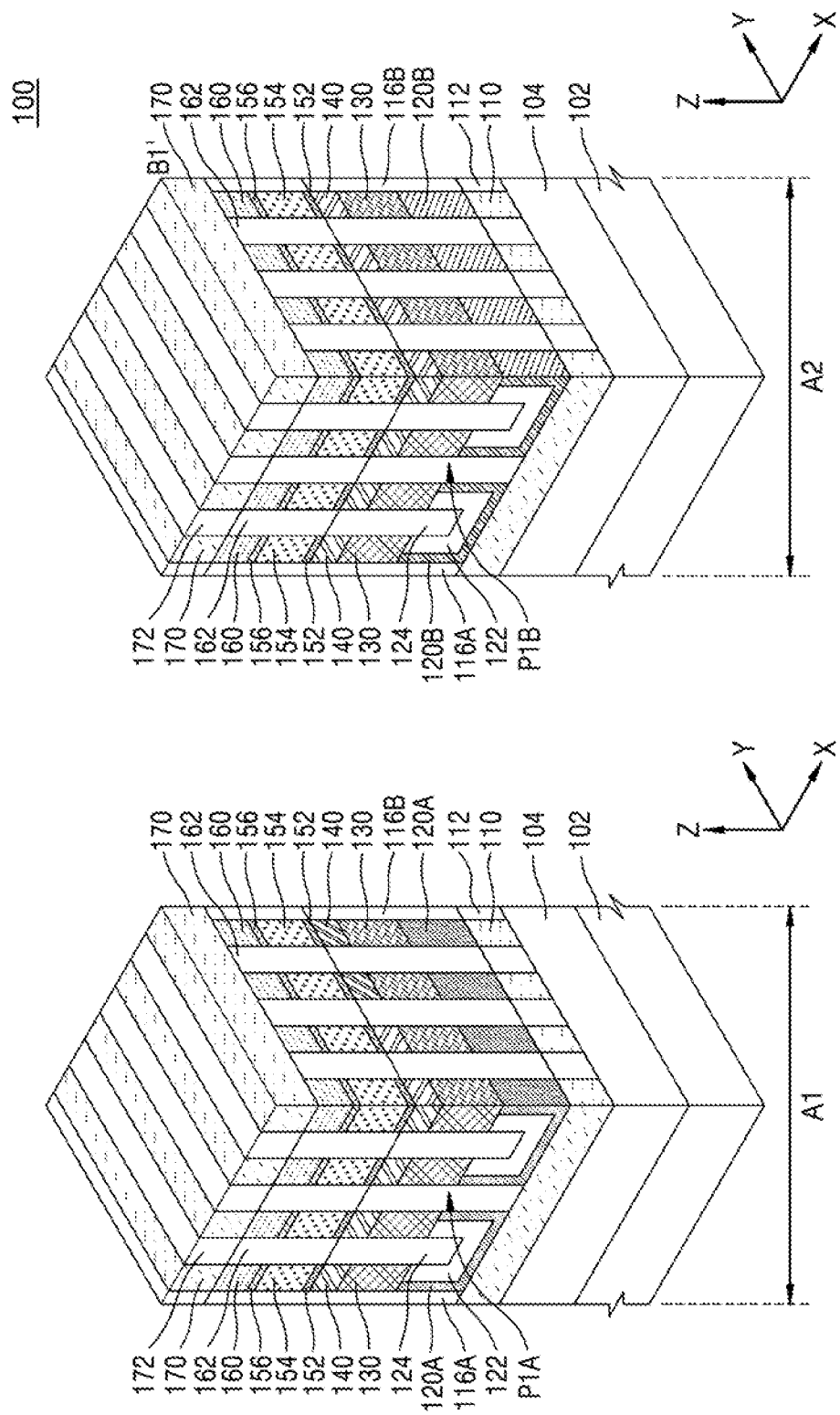
FIG. 4B is a perspective view illustrating the partial configuration of FIG. 4A.
Figure 4C:
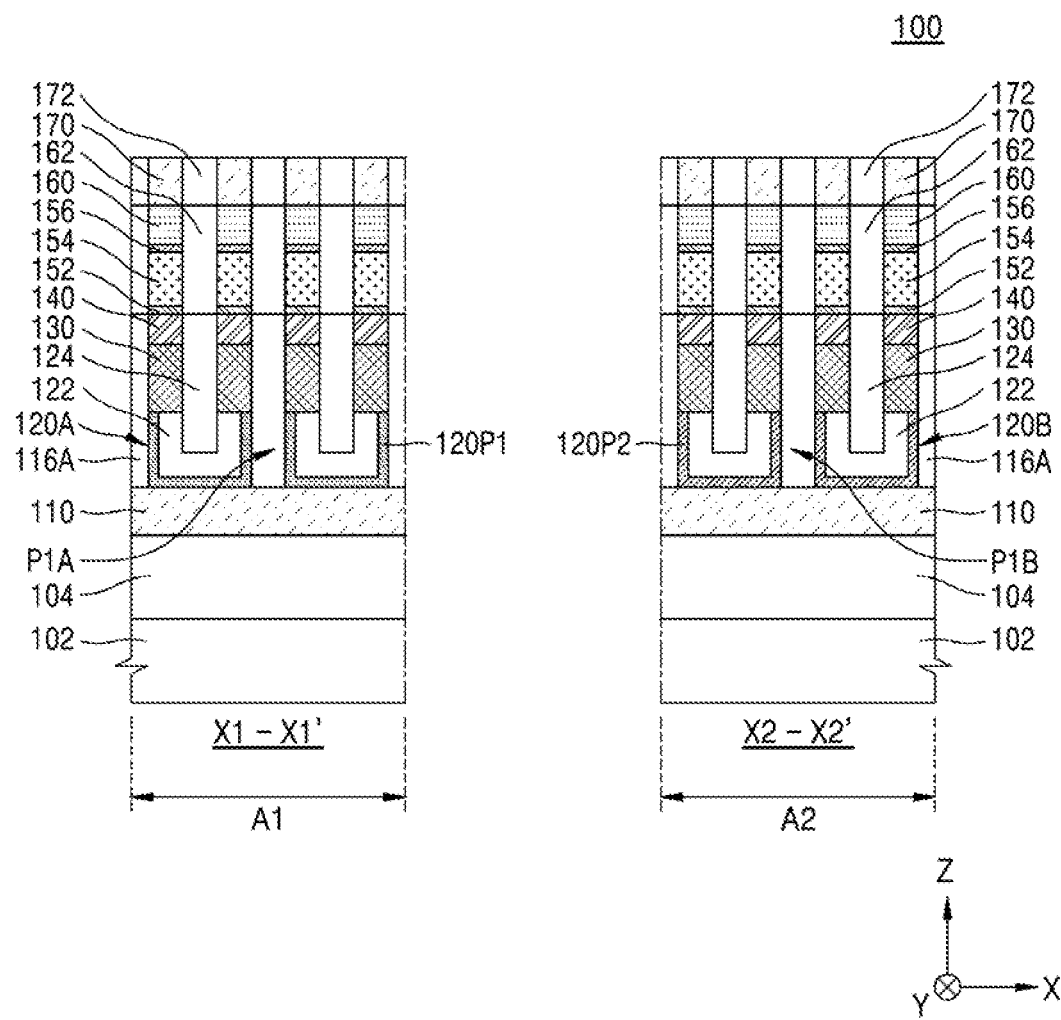
FIG. 4C illustrates cross-section views illustrating elements on cross-sections taken along lines X1-X1' and X2-X2' of FIG. 4A.

FIGS. 4A through 4C are drawings for explaining the memory device 100 according to exemplary embodiments of the inventive concept. FIG. 4A is a plan layout diagram schematically illustrating a partial configuration of the memory device 100 according to exemplary embodiments of the inventive concept, FIG. 4B is a perspective view illustrating partial configurations of a first region A1 and a second region A2 in FIG. 4A, and FIG. 4C illustrates cross-section views illustrating elements on cross-sections taken along lines X1-X1' and X2-X2' of FIG. 4A, respectively. The memory cell array MCA of the memory device 100 illustrated in FIGS. 4A through 4C may have an equivalent circuit configuration as described with reference to FIG. 3.

Referring to FIGS. 4A through 4C, the memory cell array MCA of the memory device 100 may include a plurality of first conductive lines 110 extending in parallel to each other in a first direction (an X direction) on a substrate 102, and a plurality of second conductive lines 170 extending in parallel to each other in a second direction (a Y direction) crossing the first direction (the X direction). In the present embodiment, a case where the first direction and the second direction are orthogonal to each other is described as an example, but the inventive concept is not limited thereto. In exemplary embodiments of the inventive concept, the plurality of first conductive lines 110 may constitute the $0^{th}$ through $n^{th}$ word lines WL0, WL1, ..., WLn illustrated in FIG. 3, and the plurality of second conductive lines 170 may constitute the $0^{th}$ through $m^{th}$ bit lines BL0, BL1, ..., BLm illustrated in FIG. 3. In other exemplary embodiments of the inventive concept, the plurality of first conductive lines 110 may constitute the $0^{th}$ through $m^{th}$ bit lines BL0, BL1, ..., BLm illustrated in FIG. 3, and the plurality of second conductive lines 170 may constitute the $0^{th}$ through $n^{th}$ word lines WL0, WL1, ..., WLn illustrated in FIG. 3.

An interlayer insulating layer 104 may be arranged on the substrate 102. The interlayer insulating layer 104 may include an oxide layer, a nitride layer, or a combination thereof.

The plurality of first conductive lines 110 may be connected to a driver DRV. The driver DRV may be a circuit for applying a voltage to the plurality of first conductive lines 110 and may include, for example, the row decoder RD described with reference to FIG. 2. The driver DRV may apply a voltage to an access point AP of each of the plurality of first conductive lines 110 via wirings 32. In a set write operation, a voltage may be applied through the selected first conductive line 110 and the selected second conductive line 170 to which the selected memory cell MC is connected. For example, a set high voltage may be applied to the selected first conductive line 110 via the access point AP, and a set low voltage less than the set high voltage may be applied to the selected second conductive line 170. Then, a voltage corresponding to a potential difference between the set high voltage and the set low voltage may be applied to both ends of the selected memory cell MC, and a set current may flow through the selected memory cell MC. Accordingly, current may flow through the plurality of first conductive lines 110 and the plurality of second conductive lines 170.

In the memory device 100, the memory cell array MCA may include a first region A1 at a relatively small distance from the access point AP of each of the plurality of first conductive lines 110 and a second region A2 at a relatively large distance from the access point AP of each of the plurality of first conductive lines 110. The first region A1 and the second region A2 illustrated in FIG. 4A may be variously defined, and thus, ranges and planar shapes of the first region A1 and the second region A2 are not limited thereto. The range and the planar shape of each of the first region A1 and the second region A2 in the memory cell array MCA may be variously set according to electrical characteristics required by the memory device 100.

In exemplary embodiments of the inventive concept, FIG. 4A illustrates the case in which the memory cell array MCA includes the first region A1 and the second region A2. However, the memory cell array MCA may be divided into a plurality of regions at different distances from the access point AP, for example, three or more regions. In exemplary embodiments of the inventive concept, the memory cells MC which are not included in the first region A1 and the second region A2 may have the same configuration as the plurality of memory cells MC included in the first region A1. In other exemplary embodiments of the inventive concept, the memory cells MC which are not included in the first region A1 and the second region A2 may have a different configuration from that of the plurality of memory cells MC included in each of the first region A1 and the second region A2.

Resistance components may be present in each of the plurality of first conductive lines 110 and the plurality of second conductive lines 170. Accordingly, when a current flows to the selected memory cell MC through the selected first conductive line 110 and the selected second conductive line 170, a voltage drop in a selection voltage applied to the access point AP may be generated by an IR drop that occurs between the access point AP and the selected memory cell MC via the selected first conductive line 110 and the selected second conductive line 170. The voltage drop may be greater in the second region A2, since the second region A2 is farther from the access point AP than the first region A1.

A plurality of first insulating patterns 112 may be arranged between each of the plurality of first conductive lines 110, and a plurality of second insulating patterns 172 may be arranged between each of the plurality of second conductive lines 170. The plurality of first and second insulating patterns 112 and 172 may include a silicon oxide layer, a silicon nitride layer, or a combination thereof.

The plurality of first conductive lines 110 and the plurality of second conductive lines 170 may each include a metal, a conductive metal nitride, a conductive metal oxide, or a combination thereof. In exemplary embodiments of the inventive concept, the plurality of first conductive lines 110 and the plurality of second conductive lines 170 may each include W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, indium tin oxide (ITO), or a combination thereof. The plurality of first conductive lines 110 and the plurality of second conductive lines 170 may each further include a conductive barrier layer. The conductive barrier layer may include, for example, Ti, TiN, Ta, TaN, or a combination thereof.

Memory cell pillars P1A and P1B each constituting the memory cell MC may be arranged at a plurality of intersections between the plurality of first conductive lines 110 and the plurality of second conductive lines 170. The memory cell pillars P1A are arranged in the first region A1 and the memory cell pillars P1B are arranged in the second region A2.

The memory cell pillars P1A and P1B may be mutually insulated by a plurality of first insulating wall portions 116A and a plurality of second insulating wall portions 116B. The plurality of first insulating wall portions 116A and the plurality of second insulating wall portions 116B may each include a silicon nitride layer or a silicon oxide layer.

In the first region A1, a pair of memory cell pillars P1A may be arranged between each adjacent pair of the plurality of first insulating wall portions 116A arranged in a line in the X direction. The plurality of second insulating wall portions 116B may each extend in the X direction, and the plurality of second insulating wall portions 116B and the plurality of memory cell pillars P1A may be alternately arranged in the Y direction.

In the second region A2, a pair of memory cell pillars P1B may be arranged between each adjacent pair of the plurality of first insulating wall portions 116A arranged in a line in the X direction. The plurality of second insulating wall portions 116B may each extend in the X direction, and the plurality of second insulating wall portions 116B and the plurality of memory cell pillars P1B may be alternately arranged in the Y direction.

In the first region A1, the plurality of memory cell pillars P1A may each include a first heating electrode layer 120A, a resistive memory layer 130, and an electrode layer 140, which are sequentially stacked on the first conductive line 110. In the second region A2, the plurality of memory cell pillars P1B may each include a second heating electrode layer 120B, the resistive memory layer 130, and the electrode layer 140, which are sequentially stacked on the first conductive line 110.

The first and second heating electrode layers 120A and 120B may have a substantially U-shaped cross-sectional shape. One first heating electrode layer 120A may be shared by two adjacent memory cell pillars P1A in the first region A1, and one second heating electrode layer 120B may be shared by two adjacent memory cell pillars P1B in the second region A2. A first insulating spacer 122 and a gap fill insulating layer 124 may be sequentially stacked on the first and second heating electrode layers 120A and 120B. The first insulating spacer 122 may have a substantially U-shaped cross-sectional shape. The two memory cell pillars P1A sharing one first heating electrode layer 120A may be insulated from each other by the first insulating spacer 122 and the gap fill insulating layer 124. The two memory cell pillars P1B sharing one second heating electrode layer 120B may be insulated from each other by the first insulating spacer 122 and the gap fill insulating layer 124.

The first insulating spacer 122 may include a material having an etching selectivity different from that of the plurality of first insulating wall portions 116A and the plurality of second insulating wall portions 116B, and the gap fill insulating layer 124 may include a material having an etching selectivity equal to or similar to that of the plurality of first insulating wall portions 116A and the plurality of second insulating wall portions 116B. For example, the plurality of first insulating wall portions 116A, the plurality of second insulating wall portions 116B, and the gap fill insulating layer 124 may include a silicon nitride layer, and the first insulating spacer 122 may include a silicon oxide layer. However, the inventive concept is not limited thereto.

The first and second heating electrode layers 120A and 120B may perform an operation of heating the resistive memory layer 130 in a set or reset operation. The first and second heating electrode layers 120A and 120B may each include a conductive material which is not reactive with the resistive memory layer 130 and generates sufficient heat to cause the resistive memory layer 130 to undergo the phase-change. The first heating electrode layer 120A may contact the resistive memory layer 130 in the memory cell pillar P1A, and the second heating electrode layer 120B may contact the resistive memory layer 130 in the memory cell pillar P1B.

The first heating electrode layer 120A may include a pin portion 120P1 extending from the substrate 102 toward the resistive memory layer 130, and the second heating electrode layer 120B may include a pin portion 120P2 extending from the substrate 102 the resistive memory layer 130. The first heating electrode layer 120A and the second heating electrode layer 120B may have substantially the same or similar thickness. For example, the pin portion 120P1 of the first heating electrode layer 120A and the pin portion 120P2 of the second heating electrode layer 120B may have substantially the same or similar thickness. Here, the thickness of the pin portions 120P1 and 120P2 may correspond to a width of the pin portions 120P1 and 120P2 in the X direction.

The resistive memory layer 130 in the plurality of memory cell pillars P1A in the first region A1 may contact ends of the pin portions 120P1 of the first heating electrode layer 120A that are the farthest from the substrate 102. The resistive memory layer 130 in the plurality of memory cell pillars P1B in the second region A2 may contact ends of the pin portions 120P2 of the second heating electrode layer 120B that are the farthest from the substrate 102.

Figure 5:
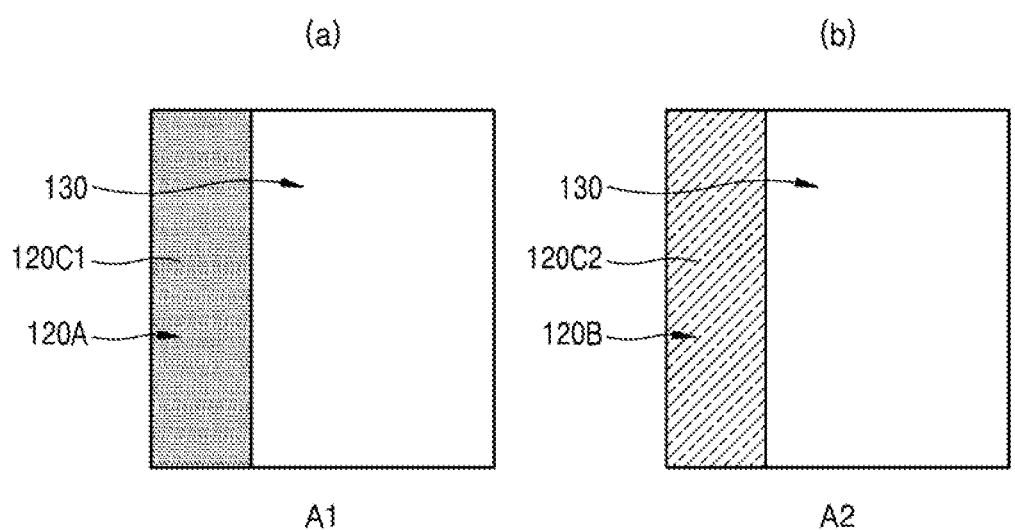
FIG. 5 illustrates enlarged plan views of a first contact surface of a first heating electrode layer included in a first region and a second contact surface of a second heating electrode layer included in a second region in a memory device illustrated in FIGS. 4A through 4C.

In FIG. 5, (a) is an enlarged plan view illustrating the resistive memory layer 130 and a first contact surface 120C1 of the first heating electrode layer 120A contacting the resistive memory layer 130 in the first region A1, and (b) is an enlarged plan view illustrating the resistive memory layer 130 and a second contact surface 120C2 of the second heating electrode layer 120B contacting the resistive memory layer 130 in the second region A2.

Referring to FIGS. 4A through 4C, and FIG. 5, the first contact surface 120C1 of the first heating electrode layer 120A and the second contact surface 120C2 of the second heating electrode layer 120B may have substantially the same or similar area. In the first region A1, the first contact surface 120C1 of the first heating electrode layer 120A may be provided by the end of one of the pin portions 120P1 of the first heating electrode layer 120A that is farthest from the substrate 102, and in the second region A2, the second contact surface 120C2 of the second heating electrode layer 120B may be provided by the end of one of the pin portions 120P2 of the second heating electrode layer 120B that is farthest from the substrate 102.

The first heating electrode layer 120A may provide a first contact resistance at the first contact surface 120C1, and the second heating electrode layer 120B may provide a second contact resistance different from the first contact resistance at the second contact surface 120C2. To accomplish this, the first heating electrode layer 120A and the second heating electrode layer 120B may have different compositions. For example, the first heating electrode layer 120A may include a material having a first resistivity, and the second heating electrode layer 120B may include a material having a second resistivity different from the first resistivity.

In exemplary embodiments of the inventive concept, a distance from the access point AP of the first conductive line 110 to the second heating electrode layer 120B may be greater than a distance from the access point AP of the first conductive line 110 to the first heating electrode layer 120A. In exemplary embodiments of the inventive concept, a second current path from the access point AP of the first conductive line 110 to the second heating electrode layer 120B may be greater than a first current path from the access point AP of the first conductive line 110 to the first heating electrode layer 120A. A second contact resistance provided by the second contact surface 120C2 of the second heating electrode layer 120B may be greater than a first contact resistance provided by the first contact surface 120C1 of the first heating electrode layer 120A. The second resistivity of the material of the second heating electrode layer 120B may be greater than the first resistivity of the material of the first heating electrode layer 120A.

In exemplary embodiments of the inventive concept, both the first heating electrode layer 120A and the second heating electrode layer 120B may include a first metal, and a content ratio of the first metal in the second heating electrode layer 120B may be less than that of the first metal in the first heating electrode layer 120A. The first metal may include Ti, Ta, W, Mo, Nb, Zr, or Al, but is not limited thereto.

In other exemplary embodiments of the inventive concept, the first heating electrode layer 120A and the second heating electrode layer 120E may each include a non-metallic element, and a content ratio of the non-metallic element in the second heating electrode layer 120B may be greater than that of the non-metallic element in the first metal layer 120A. In addition, in other exemplary embodiments of the inventive concept, the first heating electrode layer 120A and the second heating electrode layer 120B may each include a metalloid element, and a content ratio of the metalloid element in the second heating electrode layer 120B may be greater than that of the metalloid element in the first metal layer 120A.

For example, both the first heating electrode layer 120A and the second heating electrode layer 120B may include nitrogen atoms, and a content ratio of the nitrogen atoms in the second heating electrode layer 120B may be greater than that of the nitrogen atoms in the first heating electrode layer 120A. In another example, both the first heating electrode layer 120A and the second heating electrode layer 120B may include silicon atoms, and a content ratio of the silicon atoms in the second heating electrode layer 120B may be greater than that of the silicon atoms in the first heating electrode layer 120A.

In exemplary embodiments of the inventive concept, the first and second heating electrode layers 120A and 120B may each include a metal, a metal nitride, or an alloy, but compositions of the first and second heating electrode layers 120A and 120B may be different from each other. For example, the first and second heating electrode layers 120A and 120B may each include TiN, TiSiN, TiAlN, TaSiN, TaAlN, TaN, WSi, WN, TiW, MoN, NbN, TiBN, ZrSiN, WSiN, WBN, ZrAlN, MoAliN, TiAl, TiON, TiAlON, WON, TaON, TiCN, TaCN, or a combination thereof. However, the components of the first and second heating electrode layers 120A and 120B may be different from each other.

For example, both the first and second heating electrode layers 120A and 120B may each include TiSiN, and a content ratio of Ti in the second heating electrode layer 120B may be less than that of Ti in the first heating electrode layer 120A. In another example, both the first and second heating electrode layers 120A and 120B may each include TiSiN, and a content ratio of nitrogen atoms in the second heating electrode layer 120B may be greater than that of nitrogen atoms in the first heating electrode layer 120A. In yet another example, both the first and second heating electrode layers 120A and 120B may include TiSiN, and a content ratio of silicon atoms in the second heating electrode layer 120B may be greater than that of silicon atoms in the first heating electrode layer 120A.

In the plurality of memory cell pillars P1A and P1B, the resistive memory layer 130 may include the phase-change material which changes between an amorphous state and a crystalline state depending on a heating time. For example, the phase of the resistive memory layer 130 may be changed by Joule heat generated by a voltage applied to both ends of the resistive memory layer 130 and may include a material having a resistance that changes due to the changed phase. In exemplary embodiments of the inventive concept, the resistive memory layer 130 may include a chalcogenide material as a phase-change material. In exemplary embodiments of the inventive concept, the resistive memory layer 130 may include Ge—Sb—Te (GST). For example, the resistive memory layer 130 may include $Ge_2Sb_2Te_5$, $Ge_2Sb_2Te_7$, $Ge_1Sb_2Te_4$, or $Ge_1 Sb_4Te_7$.

The electrode layer 140 may include a metal, a conductive metal nitride, a conductive metal oxide, or a combination thereof. For example, the electrode layer 140 may include W, Ti, Ta, Al, Cu, C, CN, TiN, TiAlN, TiSiN, TiCN, TiCSiN, WN, CoSiN, WSiN, TaN, TaCN, TaSiN, or a combination thereof.

The plurality of memory cell pillars P1A and P1B may each further include a plurality of stacked structures formed by a first interface layer 152, a selection device layer 154, a second interface layer 156 and an electrode layer 160, which are sequentially stacked on the electrode layer 140, and an insulating layer 162 filling spaces between the plurality of stacked structures.

Each of the first interface layer 152 and the second interface layer 156 may include a conductive material, for example, carbon (C). In exemplary embodiments of the inventive concept, the first interface layer 152 and the second interface layer 156 may be omitted. The selection device layer 154 may correspond to the selection device D illustrated in FIG. 3. The selection device layer 154 may include an amorphous chalcogenide switching material. The selection device layer 154 may include a layer of material whose resistance varies depending on a magnitude of a voltage applied at both ends of the selection device layer 154. For example, the selection device layer 154 may include an Ovonic threshold switching (OTS) material. The OTS material may include a chalcogenide switching material. In exemplary embodiments of the inventive concept, the selection device layer 154 may include Si, Te, As, Ge, In, or a combination thereof. The selection device layer 154 may further include nitrogen atoms. However, a constituent material of the selection device layer 154 is not limited to the above-described examples, and various modifications are possible. A detailed configuration of the electrode layer 160 may be substantially the same as that of the electrode layer 140. The insulating layer 162 may include an oxide layer, a nitride layer, or a combination thereof.

In the memory cell array MCA of the memory device 100 described with reference to FIGS. 4A through 5, the plurality of memory cell pillars P1A in the first region A1 whose the distance from the access point AP of each of the plurality of first conductive lines 110 is relatively small may include the first heating electrode layer 120A. In addition, the plurality of memory cell pillars P1B in the second region A2 whose distance from the access point AP to each of the plurality of first conductive lines 110 is relatively large may include the second heating electrode layer 120B which has a different configuration from the first heating electrode layer 120A. Here, the first heating electrode layer 120A and the second heating electrode layer 120B may provide contact resistances of different magnitudes at the first and second contact surfaces 120C1 and 120C2 which are in contact with the resistive memory layer 130, respectively. For example, a greater contact resistance may be provided at the second contact surface 120C2 of the second heating electrode layer 120B which is located farther from the access point AP than the first contact surface 120C1 of the first heating electrode layer 120A.

As shown in the following Formula 1, a heating power provided to the first and second heating electrode layers 120A and 120B may be determined by a multiplication of a square of current flowing through the first and second heating electrode layers 120A and 120B, and a resistance of the first and second heating electrode layers 120A and 120B.

$$P=I^2R \qquad \text{[Formula 1]}$$

In Formula 1, P is the heating power, I is the current, and R is the resistance.

In the memory cell array MCA of the memory device 100 described with reference to FIGS. 4A and 5, a voltage drop occurs due to the IR drop in the selection voltage applied to the selected memory cell MC. The IR drop is caused by resistance components existing in both the plurality of first conductive lines 110 and the plurality of second conductive lines 170 in the second region A2 whose distance from the access point AP is relatively large. The heating power may be increased in the second heating electrode layer 120B by providing a relatively large contact resistance at the second contact surface 120C2 of the second heating electrode layer 120B in the second region A2 whose distance from the access point AP is relatively large. In this case, an efficiency reduction caused by the voltage drop due to the IR drop in the second region A2 may be compensated, and thus, a reduction in an operation margin may be prevented. As described above, by compensating for the voltage drop due to the IR drop at a relatively far distance from the access point AP to which the voltage is applied in the memory cell array MCA of the memory device 100, a heating efficiency may be increased by the first and second heating electrode layers 120A and 120B in all regions of the memory cell array MCA regardless of their distance from the access point AP. Thus, the reliability of the memory device 100 may be increased, and a higher speed and a larger capacity of the memory device 100 may be obtained.

Figure 6:
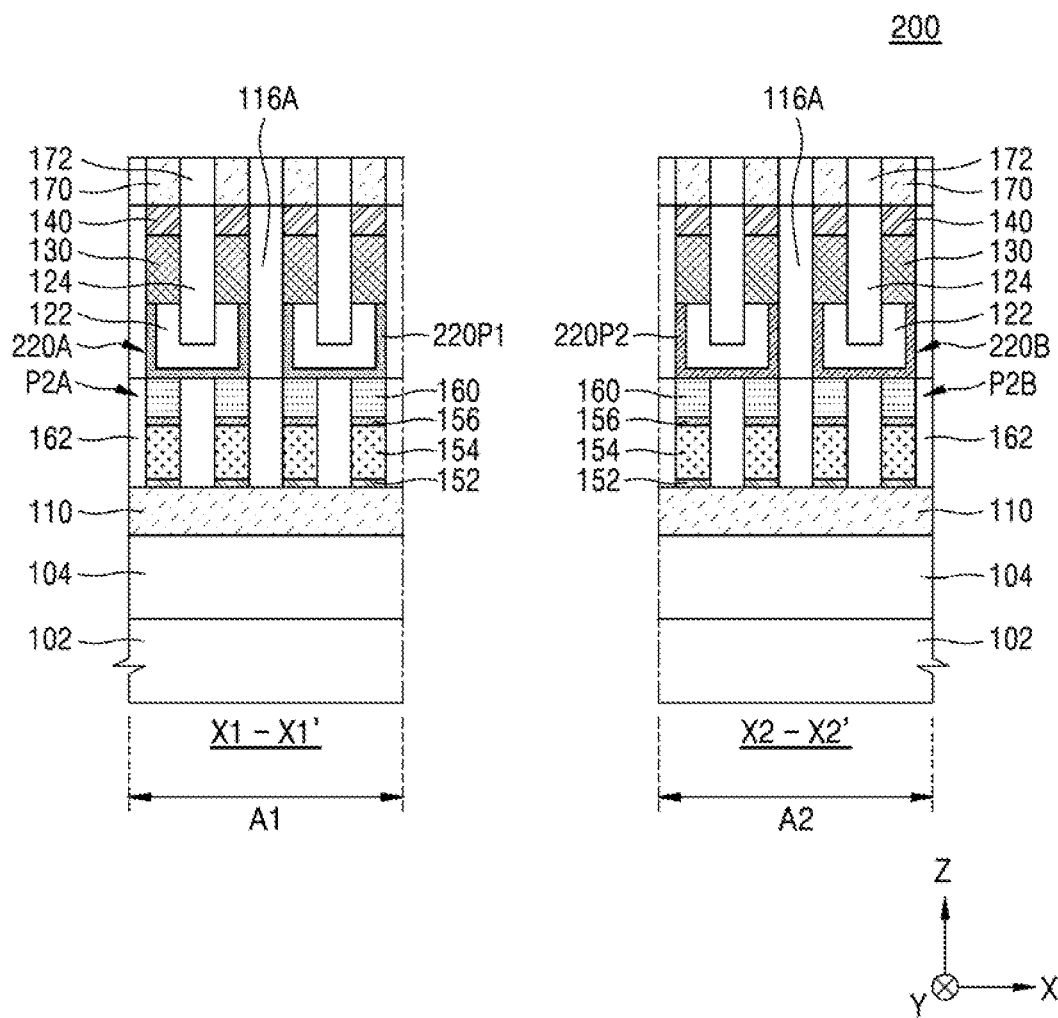
FIGS. 6, 7, 8 and 9 are cross-sectional views illustrating memory devices according to exemplary embodiments of the inventive concept.

FIG. 6 is a cross-sectional view for explaining a memory device 200 according to exemplary embodiments of the inventive concept. In FIG. 6, the same reference numerals as in FIGS. 4A through 5 may denote the same elements, and thus, a duplicated explanation thereof may be omitted. FIG. 6 illustrates components of the portions corresponding to the cross-sections taken along the X1-X1' line and the X2-X2' line in FIG. 4A.

Referring to FIG. 6, the memory device 200 may have substantially the same configuration as the memory device 100 described with reference to FIGS. 4A through 5. However, the plurality of memory cell pillars P2A and P2B included in the memory cell array MCA of the memory device 200 may include a first heating electrode layer 220A and a second heating electrode layer 220B instead of the first and second heating electrode layers 120A and 120B. The first and second heating electrode layers 220A and 220B may include the first heating electrode layer 220A constituting the memory cell pillar P2A in the first region A1 and the second heating electrode layer 220B constituting the memory cell pillar P2B in the second region A2. The first heating electrode layer 220A may have a pin portion 220P1 in contact with the resistive memory layer 130 in the first region A1, and the second heating electrode layer 220B may include a pin portion 220P2 in contact with the resistive memory layer 130 in the second region A2. A more detailed configuration of the first and second heating electrode layers 220A and 220B may be substantially the same as that described for the first and second heating electrode layers 120A and 120B with reference to FIGS. 4A through 5.

In the plurality of memory cell pillars P2A and P2B of the memory device 200, a plurality of stacked structures may be arranged between the plurality of first conductive lines 110 and the plurality of first and second heating electrode layers 220A and 220B. Each of the stacked structures may include the first interface layer 152, the selection device layer 154, the second interface layer 156, and the electrode layer 160 which are sequentially stacked, and an insulating layer 162 may be provided to fill spaces between the plurality of stacked structures. Thus, the first interface layer 152 and the first conductive line 110 may be in contact with each other, and the electrode layer 140 and the second conductive line 170 may be in contact with each other.

Figure 7:
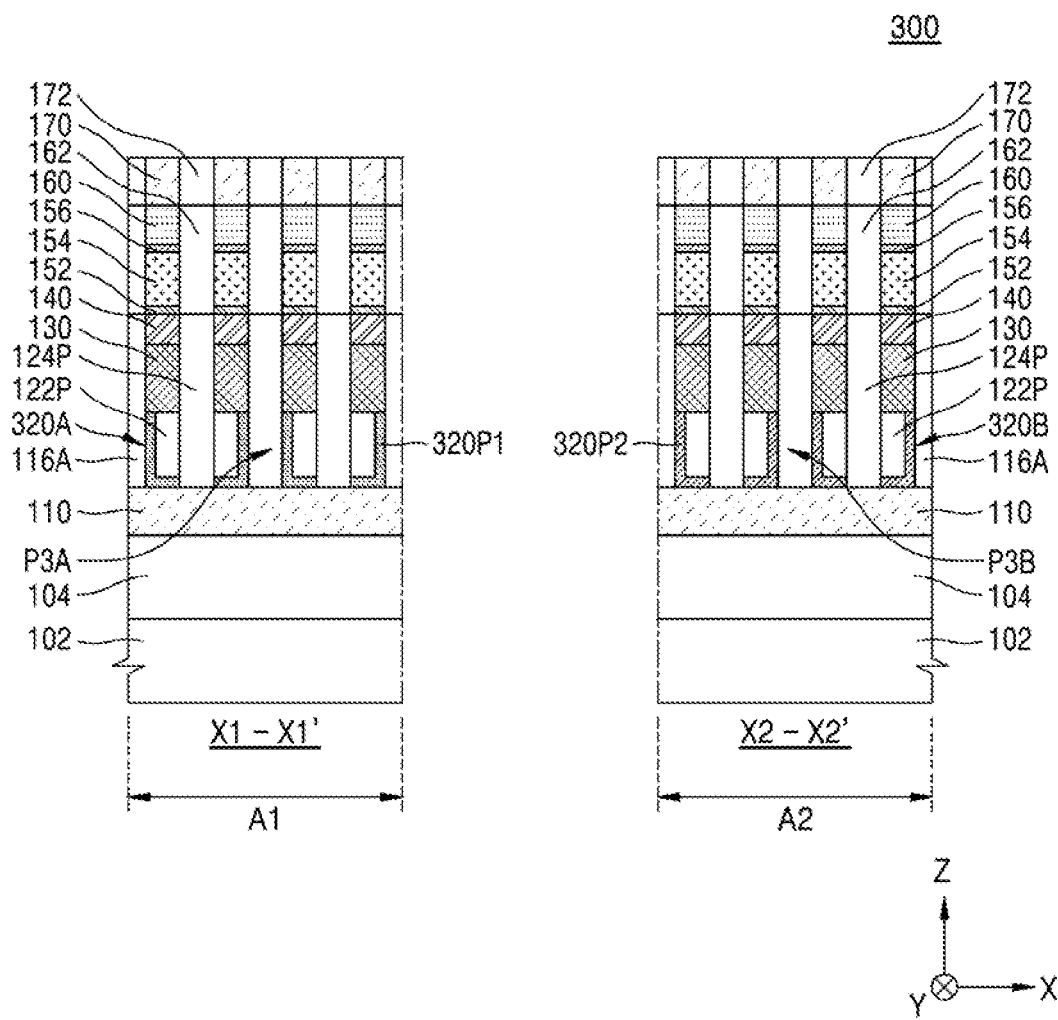

FIG. 7 is a cross-sectional view for explaining a memory device 300 according to exemplary embodiments of the inventive concept. In FIG. 7, the same reference numerals as in FIGS. 4A through 5 may denote the same elements, and thus, a duplicated explanation thereof may be omitted. FIG. 7 illustrates components of the portions corresponding to the cross-sections taken along the X1-X1' line and the X2-X2' line in FIG. 4A.

Referring to FIG. 7, the memory device 300 may have substantially the same configuration as the memory device 100 described with reference to FIGS. 4A through 5. The memory device 300 may have the equivalent circuit configuration illustrated in FIG. 3. However, a plurality of memory cell pillars P3A and a plurality of memory cell pillars P3B included in the memory cell array MCA of the memory device 300 may include a first heating electrode layer 320A and a second heating electrode layer 320B instead of the first and second heating electrode layers 120A and 120B. The first and second heating electrode layers 320A and 320B may include the first heating electrode layer 320A constituting a memory cell pillar P3A in the first region A1, and the second heating electrode layer 320B constituting a memory cell pillar P3B in the second region A2. The first and second heating electrode layers 320A and 320B may not be shared by two adjacent memory cell pillars P3A and P3B.

The first heating electrode layer 320A may have a pin portion 320P1 in contact with the resistive memory layer 130 in the first region A1, and the second heating electrode layer 320B may include a pin portion 320P2 in contact with the resistive memory layer 130 in the second region A2. A more detailed configuration of the first and second heating electrode layers 320A and 320B may be substantially the same as that described for the first and second heating electrode layers 120A and 120B with reference to FIGS. 4A through 5.

In addition, the plurality of memory cell pillars P3A and P3B included in the memory cell army MCA of the memory device 300 may include a first insulating spacer 122P and a gap fill insulating layer 124P instead of the first insulating spacer 122 and the gap fill insulating layer 124. A more detailed configuration of the first insulating spacer 122P and the gap fill insulating layer 124P may be substantially the same as that described for the first insulating spacer 122 and the gap fill insulating layer 124 with reference to FIGS. 4A through 4C. However, the first insulating spacer 122P may have a line-shaped cross-sectional structure. The first insulating spacer 122P may be arranged between the first heating electrode layer 320A and the resistive memory layer 130 in the first region A1, and may be arranged between the second heating electrode layer 320B and the resistive memory layer 130 in the second region A2. Two adjacent first heating electrode layers 320A and two adjacent first insulating spacers 122P may be respectively separated from each other by the gap fill insulating layer 124P in the first region A1. Two adjacent second heating electrode layers 320B and two adjacent first insulating spacers 122P may be respectively separated from each other by the gap fill insulating layer 124P in the second region A2.

Figure 8:
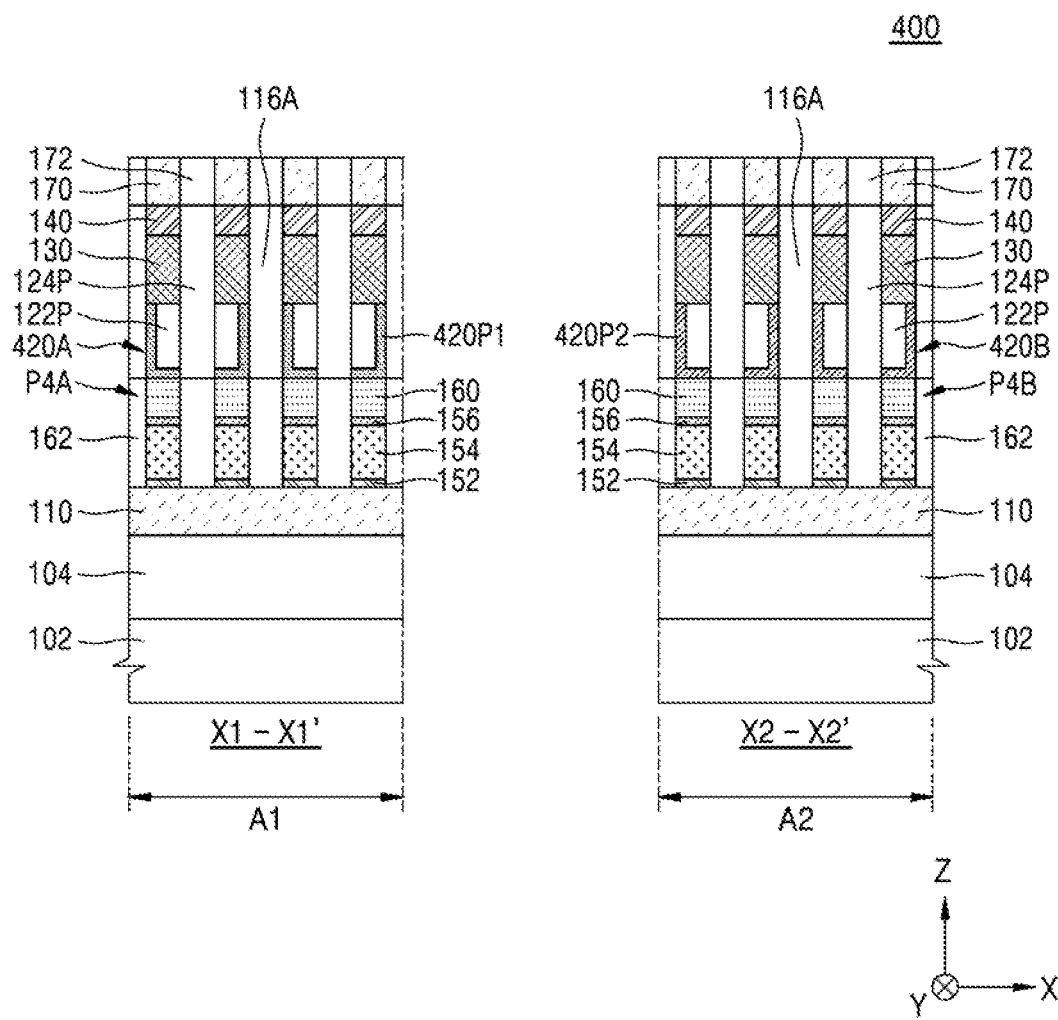

FIG. 8 is a cross-sectional view for explaining a memory device 400 according to exemplary embodiments of the inventive concept. In FIG. 8, the same reference numerals as in FIGS. 4A through 6 may denote the same elements, and thus, a duplicated explanation thereof may be omitted. FIG. 8 illustrates components of the portions corresponding to the cross-sections taken along the X1-X1' line and the X2-X2' line in FIG. 4A.

Referring to FIG. 8, the memory device 400 may have substantially the same configuration as the memory device 200 described with reference to FIG. 6. However, a plurality of memory cell pillars P4A and a plurality of memory cell pillars P4B included in the memory cell array MCA of the memory device 400 may include a first heating electrode layer 420A and a second heating electrode layer 420B instead of the first and second heating electrode layers 220A and 220B. The first and second heating electrode layers 420A and 420B may include the first heating electrode layer 420A constituting a memory cell pillar P4A in the first region A1, and the second heating electrode layer 420B constituting a memory cell pillar P4B in the second region A2. The first and second heating electrode layers 420A and 420B may not be shared by two adjacent memory cell pillars P4A and P4B.

The first heating electrode layer 420A may have a pin portion 420P1 in contact with the resistive memory layer 130 in the first region A1, and the second heating electrode layer 420B may include a pin portion 420P2 in contact with the resistive memory layer 130 in the second region A2. A more detailed configuration of the first and second heating electrode layers 420A and 420B may be substantially the same as that described for the first and second heating electrode layers 120A and 120B with reference to FIGS. 4A through 5.

In addition, the plurality of memory cell pillars P4A and P4B included in the memory cell array MCA of the memory device 400 may include a first insulating spacer 122P and a gap fill insulating layer 124P instead of the first insulating spacer 122 and the gap fill insulating layer 124. A more detailed configuration of the first insulating spacer 122P and the gap fill insulating layer 124P is similar to that described with reference to FIG. 7.

In the memory devices 200, 300, and 400 illustrated in FIGS. 6 through 8, similar to the memory device 100 described with reference to FIGS. 4A through 5, a contact resistance at a contact surface with the second heating electrode layers 220B, 320B, and 420B and the resistive memory layer 130 may be greater than a contact resistance at a contact surface with the first heating electrode layers 220A, 320A, 420A and the resistive memory layer 130. Thus, it is possible to increase the heating power in the second heating electrode layers 220B, 320B, and 420B, and accordingly, compensate for the efficiency drop due to the voltage drop caused by the IR drop in the second region A2.

Figure 9:
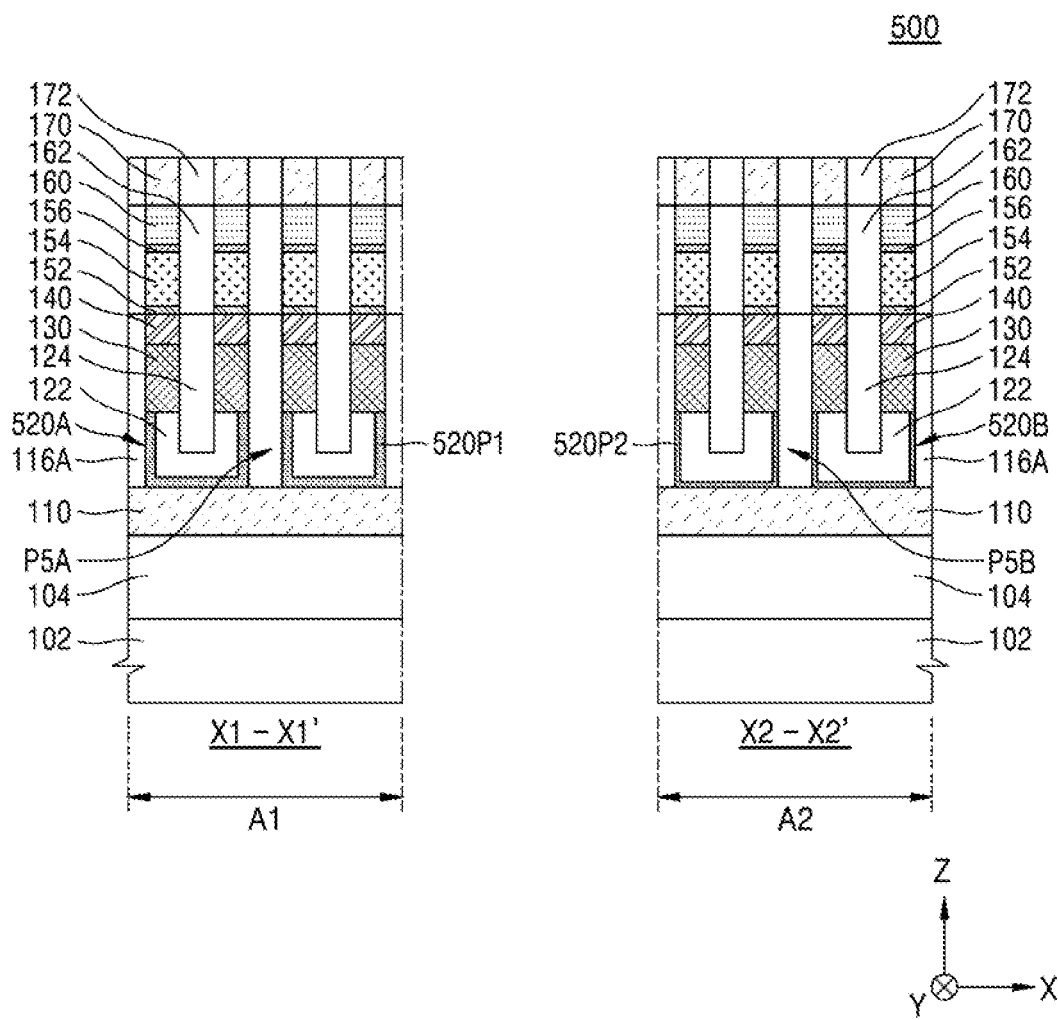

FIG. 9 is a cross-sectional view for explaining a memory device 500 according to exemplary embodiments of the inventive concept. In FIG. 9, the same reference numerals as in FIGS. 4A through 4C may denote the same elements, and thus, a duplicated explanation thereof may be omitted. FIG. 9 illustrates components of the portions corresponding to the cross-sections taken along the X1-X1' line and the X2-X2' line in FIG. 4A.

Referring to FIG. 9, the memory device 500 may have substantially the same configuration as the memory device 100 described with reference to FIGS. 4A through 4C. The memory device 500 may have the equivalent circuit configuration illustrated in FIG. 3. However, a plurality of memory cell pillars P5A and a plurality of memory cell pillars P5B included in the memory cell array MCA of the memory device 500 may include a first heating electrode layer 520A and a second heating electrode layer 520B instead of the first and second heating electrode layers 120A and 120B. The first and second heating electrode layers 520A and 520B may include the first heating electrode layer 520A constituting a memory cell pillar P5A in the first region A1, and the second heating electrode layer 520B constituting a memory cell pillar P5B in the second region A2. The first heating electrode layer 520A may have a pin portion 520P1 in contact with the resistive memory layer 130 in the first region A1, and the second heating electrode layer 520B may include a pin portion 520P2 in contact with the resistive memory layer 130 in the second region A2.

The first and second heating electrode layers 520A and 520B may have the same composition. The first and second heating electrode layers 520A and 520B may each have substantially the same configuration as that described for the first heating electrode layer 120A with reference to FIGS. 4A through 5. For example, the first and second heating electrode layers 520A and 520B may each include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, TiCN, TaCN, or a combination thereof. However, a thickness of the second heating electrode layer 520B may be less than that of the first heating electrode layer 520A. For example, a thickness of the pin portion 520P2 of the second heating electrode layer 520B may be less than that of the pin portion 520P1 of the first heating electrode layer 520A. Here, the thicknesses of the pin portions 520P1 and 520P2 may indicate magnitudes (e.g., widths) of the pin portions 520P1 and 520P2 in the X direction. A thickness difference between the first heating electrode layer 520A and the second heating electrode layer 520B may not be limited and, for example, may be variously selected depending on required electrical characteristics in the memory device 500. For example, the thickness of the pin portion 520P2 of the second heating electrode layer 520B may be about 0.1 to about 0.9 times the thickness of the pin portion 520P1 of the first heating electrode layer 520A, but is not limited thereto.

The resistive memory layer 130 in the plurality of memory cell pillars P5A in the first region A1 may contact an end of the pin portions 520P1 of the first heating electrode layer 520A that is farthest from the substrate 102. The resistive memory layer 130 in the plurality of memory cell pillars P5B in the second region A2 may contact an end of the pin portions 520P2 of the second heating electrode layer 520B that is farthest from the substrate 102.

Figure 10:
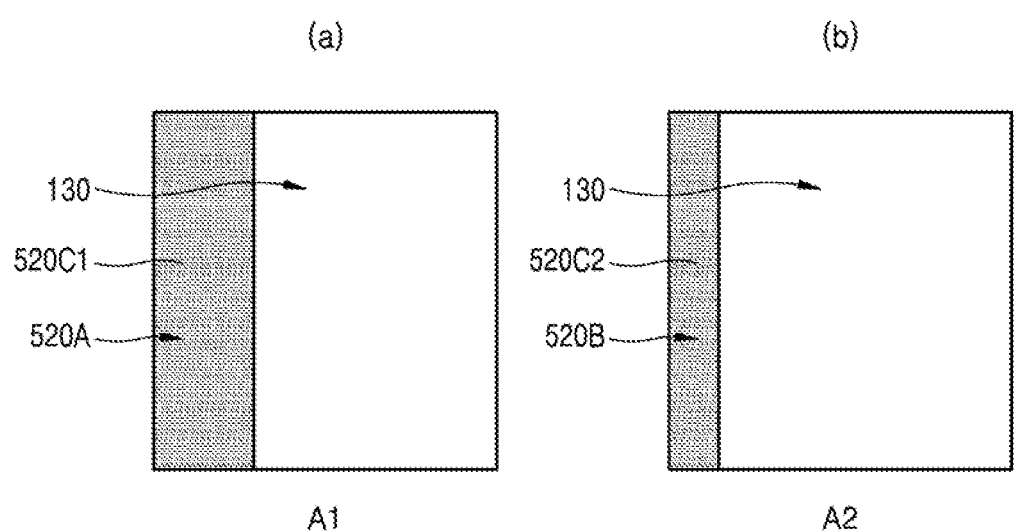
FIG. 10 shows enlarged plan views illustrating a first contact surface of a first heating electrode layer included in a first region and a second contact surface of a second heating electrode layer included in a second region in a memory device illustrated in FIG. 9.

In FIG. 10, (a) is an enlarged plan view illustrating the resistive memory layer 130 and a first contact surface 520C1 of the first heating electrode layer 520A contacting the resistive memory layer 130 in the first region A1, and (b) is an enlarged plan view illustrating the resistive memory layer 130 and a second contact surface 520C2 of the second heating electrode layer 520B contacting the resistive memory layer 130 in the second region A2.

Referring to FIGS. 9 and 10, the area of the second contact surface 520C2 of the second heating electrode layer 520B may be less than that of the first contact surface 520C1 of the first heating electrode layer 520A. Accordingly, a contact resistance provided at the second contact surface 520C2 of the second heating electrode layer 520B may be greater than that provided at the first contact surface 520C1 of the first heating electrode layer 520A.

When a current path from the access point AP of the first conductive line 110 to the second heating electrode layer 520B is longer than a current path from the access point AP to the first heating electrode layer 520A, by providing a relatively large contact resistance, it is possible to increase the heating power in the second heating electrode layer 520B, thereby compensating for the efficiency drop due to the voltage drop caused by the IR drop in the second region A2.

Figure 11:
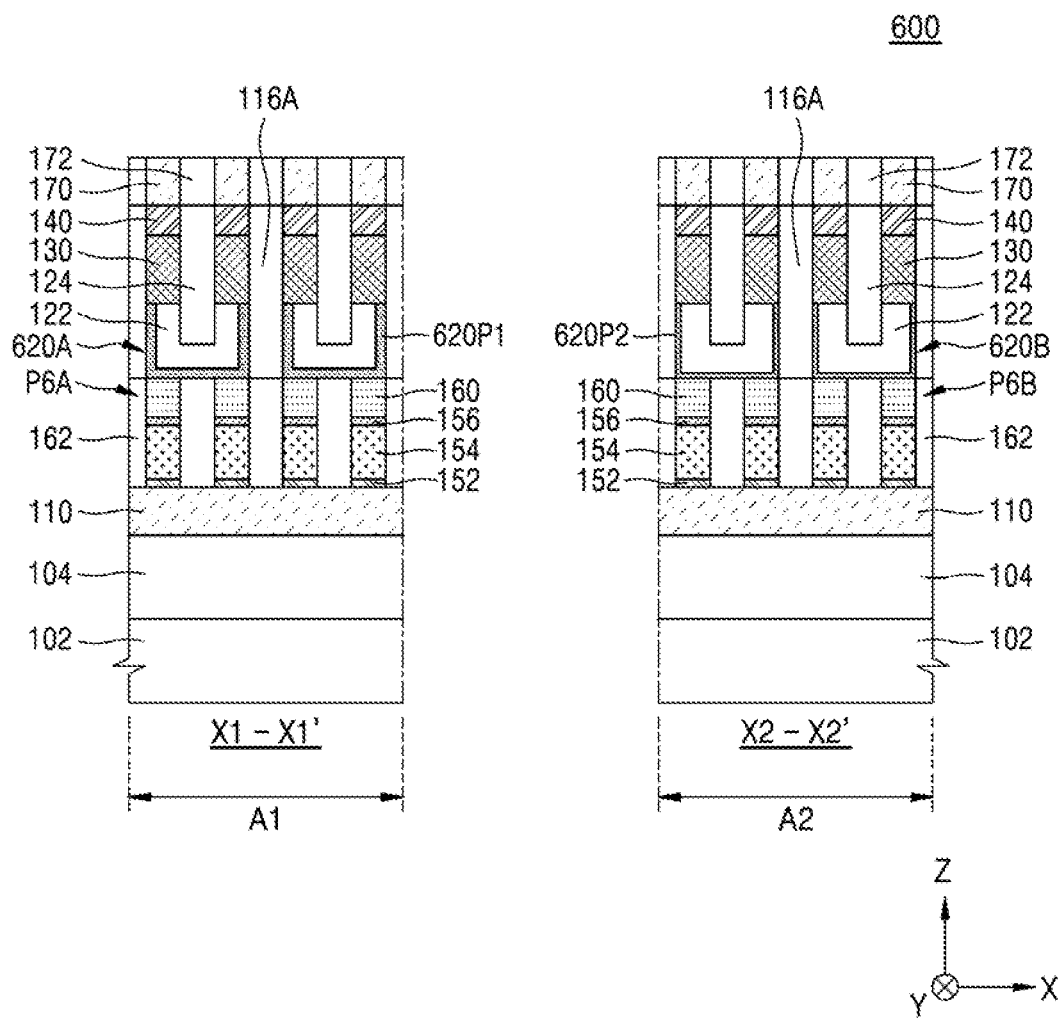
FIGS. 11, 12 and 13 are cross-sectional views illustrating memory devices according to exemplary embodiments of the inventive concept.

FIG. 11 is a cross-sectional view for explaining a memory device 600 according to exemplary embodiments of the inventive concept. In FIG. 11, the same reference numerals as in FIGS. 4A through 9 may denote the same elements, and thus, a duplicated explanation thereof is omitted. FIG. 11 illustrates components of the portions corresponding to the cross-sections taken along the X1-X1' line and the X2-X2' line in FIG. 4A.

Referring to FIG. 11, the memory device 600 may have substantially the same configuration as the memory device 500 described with reference to FIG. 9. However, the plurality of memory cell pillars P6A and P6B included in the memory cell array MCA of the memory device 600 may include a first heating electrode layer 620A and a second heating electrode layer 620B instead of the first and second heating electrode layers 520A and 520B, respectively. The first and second heating electrode layers 620A and 620B may include the first heating electrode layer 620A constituting a memory cell pillar P6A in the first region A1 and the second heating electrode layer 620B constituting a memory cell pillar P6B in the second region A2. The first heating electrode layer 620A may have a pin portion 620P1 in contact with the resistive memory layer 130 in the first region A1, and the second heating electrode layer 620B may include a pin portion 620P2 in contact with the resistive memory layer 130 in the second region A2. A more detailed configuration of the first and second heating electrode layers 620A and 620B may be substantially the same as that described for the first and second beating electrode layers 520A and 520B with reference to FIGS. 9 and 10.

In the plurality of memory cell pillars P6A and P6B of the memory device 600, a plurality of stacked structures may be arranged between the plurality of first conductive lines 110 and the plurality of first and second heating electrode layers 620A and 620B. Each of the stacked structures includes the first interface layer 152, the selection device layer 154, the second interface layer 156, and the electrode layer 160 which are sequentially stacked, and an insulating layer 162 may fill spaces between the plurality of stacked structures. Accordingly, the first interface layer 152 and the first conductive line 110 may be in contact with each other, and the electrode layer 140 and the second conductive line 170 may be in contact with each other.

Figure 12:
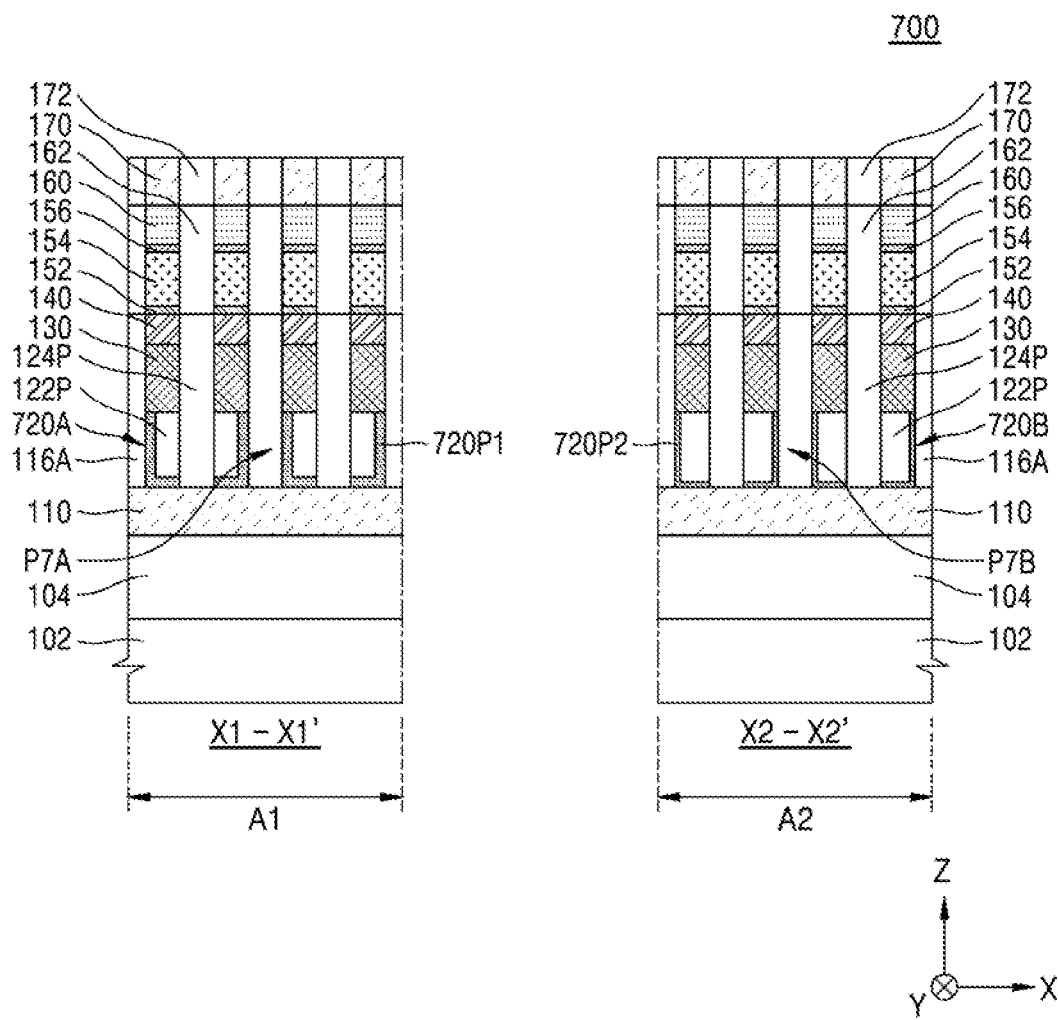

FIG. 12 is a cross-sectional view for explaining a memory device 700 according to exemplary embodiments of the inventive concept. In FIG. 12, the same reference numerals as in FIGS. 4A through 9 may denote the same elements, and thus, a duplicated explanation thereof is omitted. FIG. 12 illustrates components of the portions corresponding to the cross-sections taken along the X1-X1' line and the X2-X2' line in FIG. 4A.

Referring to FIG. 12, the memory device 700 may have substantially the same configuration as the memory device 500 described with reference to FIG. 9. The memory device 700 may have the equivalent circuit configuration illustrated in FIG. 3. However, a plurality of memory cell pillars P7A and a plurality of memory cell pillars P7B included in the memory cell array MCA of the memory device 700 may include a first heating electrode layer 720A and a second heating electrode layer 720B instead of the first and second heating electrode layers 520A and 520B, respectively. The first and second heating electrode layers 720A and 720B may include the first heating electrode layer 720A constituting a memory cell pillar P7A in the first region A1, and the second heating electrode layer 720B constituting a memory cell pillar P7B in the second region A2. The first and second heating electrode layers 720A and 720B may not be shared by two adjacent memory cell pillars P7A and P7B, respectively.

The first heating electrode layer 720A may have a pin portion 720P1 in contact with the resistive memory layer 130 in the first region A1, and the second heating electrode layer 720B may include a pin portion 720P2 in contact with the resistive memory layer 130 in the second region A2. A more detailed configuration of the first and second heating electrode layers 720A and 720B may be substantially the same as that described for the first and second heating electrode layers 520A and 520B with reference to FIGS. 9 and 10.

In addition, the plurality of memory cell pillars P7A and P7B included in the memory cell array MCA of the memory device 700 may include the first insulating spacer 122P and the gap fill insulating layer 124P instead of the first insulating spacer 122 and the gap fill insulating layer 124. A more detailed configuration of the first insulating spacer 122P and the gap fill insulating layer 124P is the same as that described with reference to FIG. 7.

Figure 13:
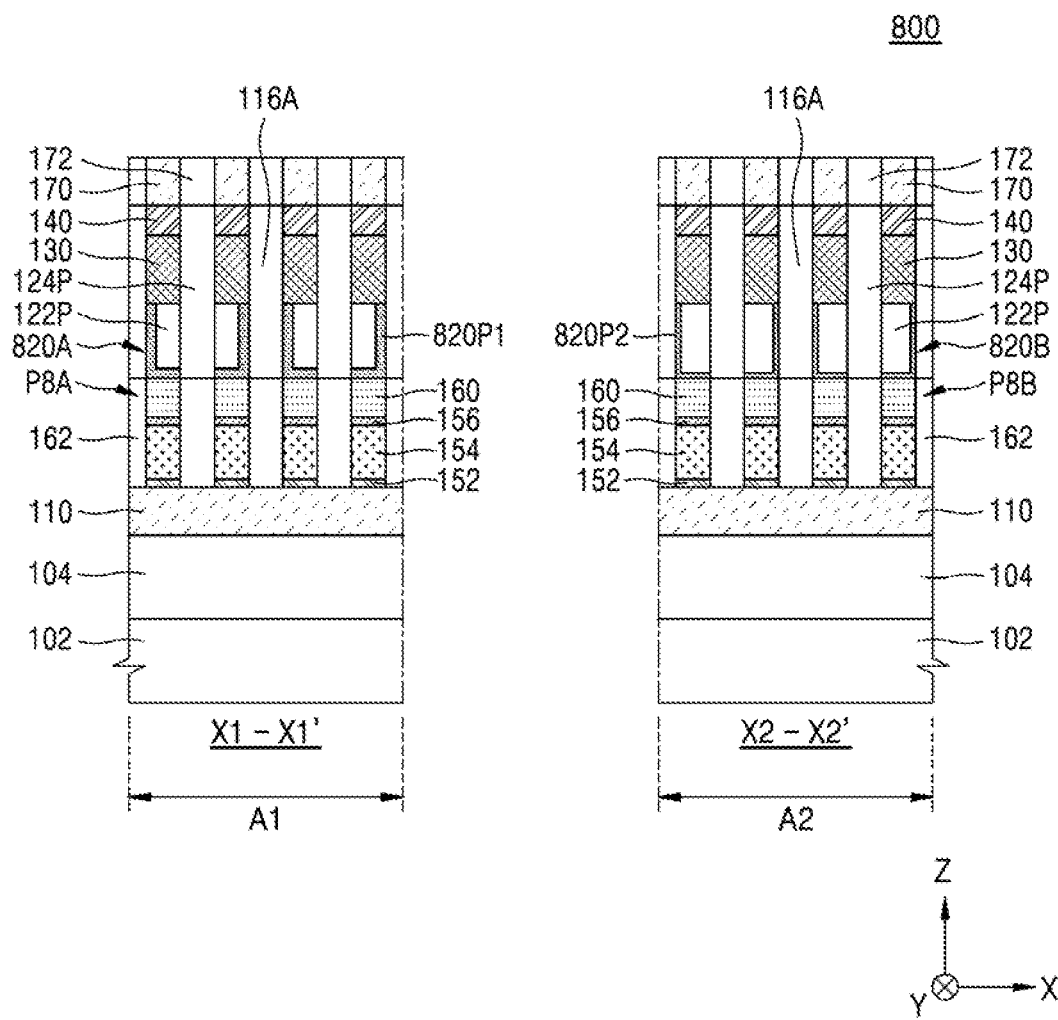

FIG. 13 is a cross-sectional view for explaining a memory device 800 according to exemplary embodiments of the inventive concept. In FIG. 13, the same reference numerals as in FIGS. 4A through 11 may denote the same elements, and thus, a duplicated explanation thereof may be omitted. FIG. 13 illustrates components of the portions corresponding to the cross-sections taken along the X1-X1' line and the X2-X2' line in FIG. 4A.

Referring to FIG. 13, the memory device 800 may have substantially the same configuration as the memory device 600 described with reference to FIG. 11. However, a plurality of memory cell pillars P8A and a plurality of memory cell pillars P8B included in the memory cell array MCA of the memory device 800 may include a first heating electrode layer 820A and a second heating electrode layer 820B instead of the first and second heating electrode layers 620A and 620B, respectively. The first and second heating electrode layers 820A and 820B may include the first heating electrode layer 820A constituting a memory cell pillar P8A in the first region A1, and the second heating electrode layer 820B constituting a memory cell pillar P8B in the second region A2. The first and second heating electrode layers 820A and 820B may not be shared by two adjacent memory cell pillars P8A and P8B.

The first heating electrode layer 820A may have a pin portion 820P1 in contact with the resistive memory layer 130 in the first region A1, and the second heating electrode layer 820B may include a pin portion 820P2 in contact with the resistive memory layer 130 in the second region A2. A more detailed configuration of the first and second heating electrode layers 820A and 820B may be substantially the same as that described for the first and second heating electrode layers 520A and 520B with reference to FIGS. 9 and 10.

In addition, the plurality of memory cell pillars P8A and P8B included in the memory cell array MCA of the memory device 800 may include the first insulating spacer 122P and the gap fill insulating layer 124P instead of the first insulating spacer 122 and the gap fill insulating layer 124, respectively. A more detailed configuration of the first insulating spacer 122P and the gap fill insulating layer 124P is the same as that described with reference to FIG. 7.

In the memory devices 600, 700, and 800 illustrated in FIGS. 11 through 13, similar to the memory device 500 described with reference to FIGS. 9 and 10, a contact resistance at a contact surface with the second heating electrode layers 620B, 720B, and 820B and the resistive memory layer 130 may be greater than a contact resistance at a contact surface with the first heating electrode layers 620A, 720A, 820A and the resistive memory layer 130. Thus, it is possible to increase the heating power in the second heating electrode layers 620B, 720B, and 820B, and accordingly, compensate for the efficiency drop due to the voltage drop caused by the IR, drop in the second region A2.

FIGS. 14A through 14J are cross-sectional views illustrating a method of fabricating a memory device according to exemplary embodiments of the inventive concept. The example method of fabricating the memory device 100 illustrated in FIGS. 4A through 4C is described with reference to FIGS. 14A through 14J. FIGS. 14A through 14J illustrate components corresponding to the cross-sections taken along the X1-X1' line and the X2-X2' line in FIG. 4A according to a processing sequence.

Figure 14A:
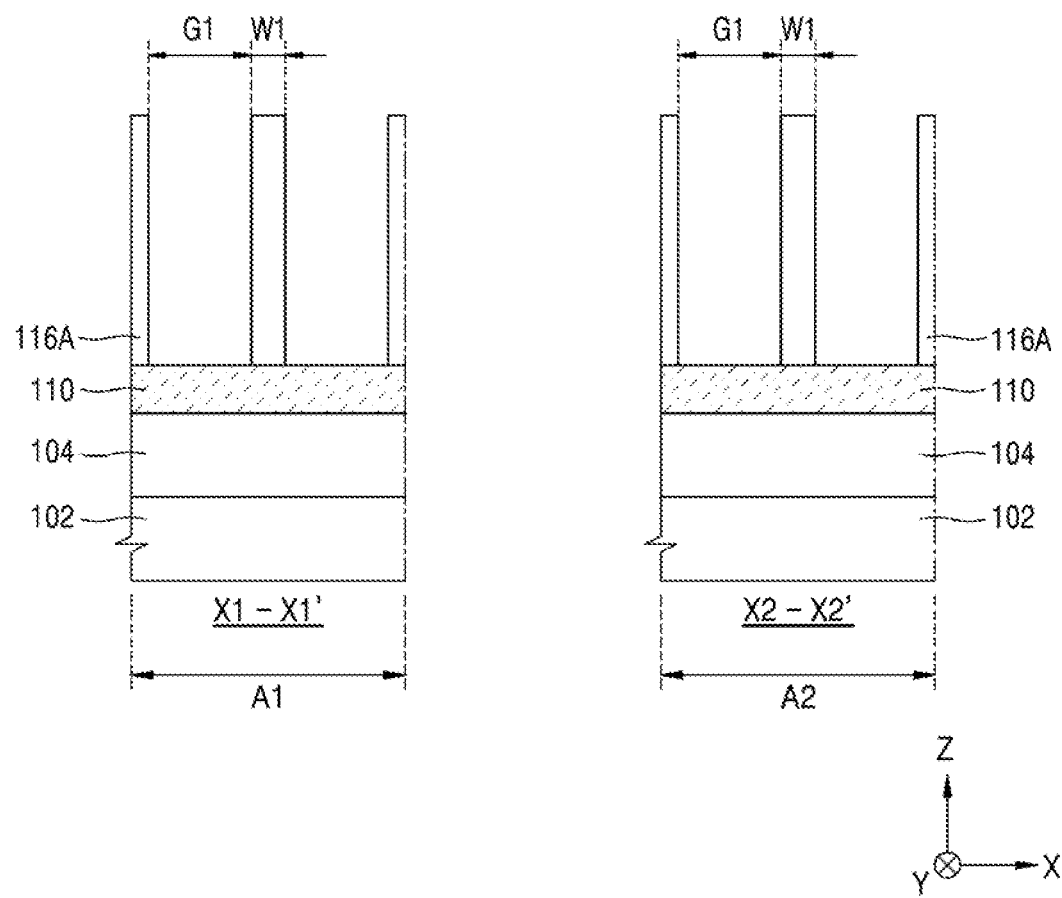
FIGS. 14A, 14B, 14C, 14D, 14E, 14F, 14G, 14H, 14I and 14J are cross-sectional views illustrating a method of fabricating a memory device according to exemplary embodiments of the inventive concept.

Referring to FIG. 14A, the interlayer insulating layer 104 may be formed on the substrate 102 including the first region A1 and the second region A2, and the plurality of first conductive lines 110 and the plurality of first insulating patterns 112 (refer to FIG. 4B) insulating spaces between the plurality of first conductive lines 110 may be formed on the interlayer insulating layer 104.

The plurality of first insulating wall portions 116A may be formed on the plurality of first conductive lines 110 and the plurality of first insulating patterns 112. The plurality of first insulating wall portions 116A may extend parallel to each other in the Y direction. The plurality of first insulating wall portions 116A may each have a first width W1 in the X direction and may be apart from each other with a first gap G1 therebetween. The first gap G1 may be about three times the first width W1.

Figure 14B:
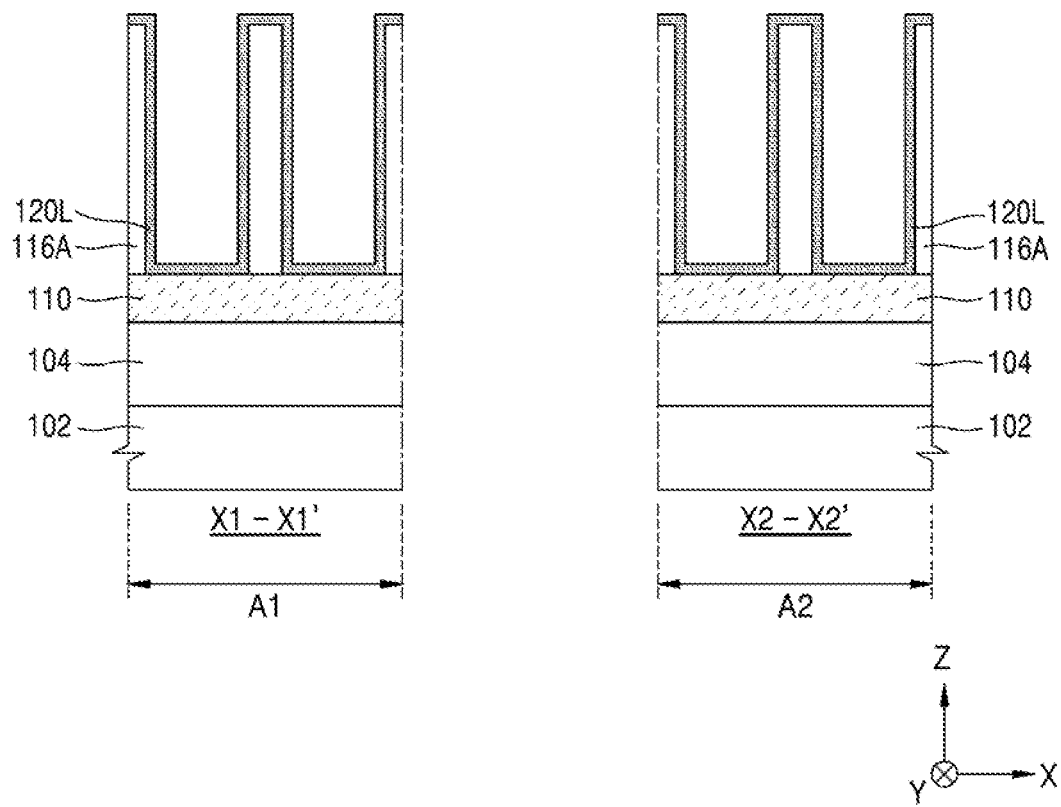

Referring to FIG. 14B, in the first region A1 and the second region A2, a preliminary heating electrode layer 120L may be formed which conformally covers respective exposed surfaces of the plurality of first insulating wall portions 116A, the plurality of first conductive lines 110, and the plurality of first insulating patterns 112. Thicknesses of the preliminary heating electrode layer 120L in the first region A1 and the second region A2 may be substantially the same. The thickness of the preliminary heating electrode layer 120L may be substantially the same as a thickness of the first heating electrode layer 120A to be formed in the first region A1 (refer to FIGS. 4B and 4C).

In exemplary embodiments of the inventive concept, a constituent material of the preliminary heating electrode layer 120L may be the same as that of the first heating electrode layer 120A to be formed in the first region A1.

Figure 14C:
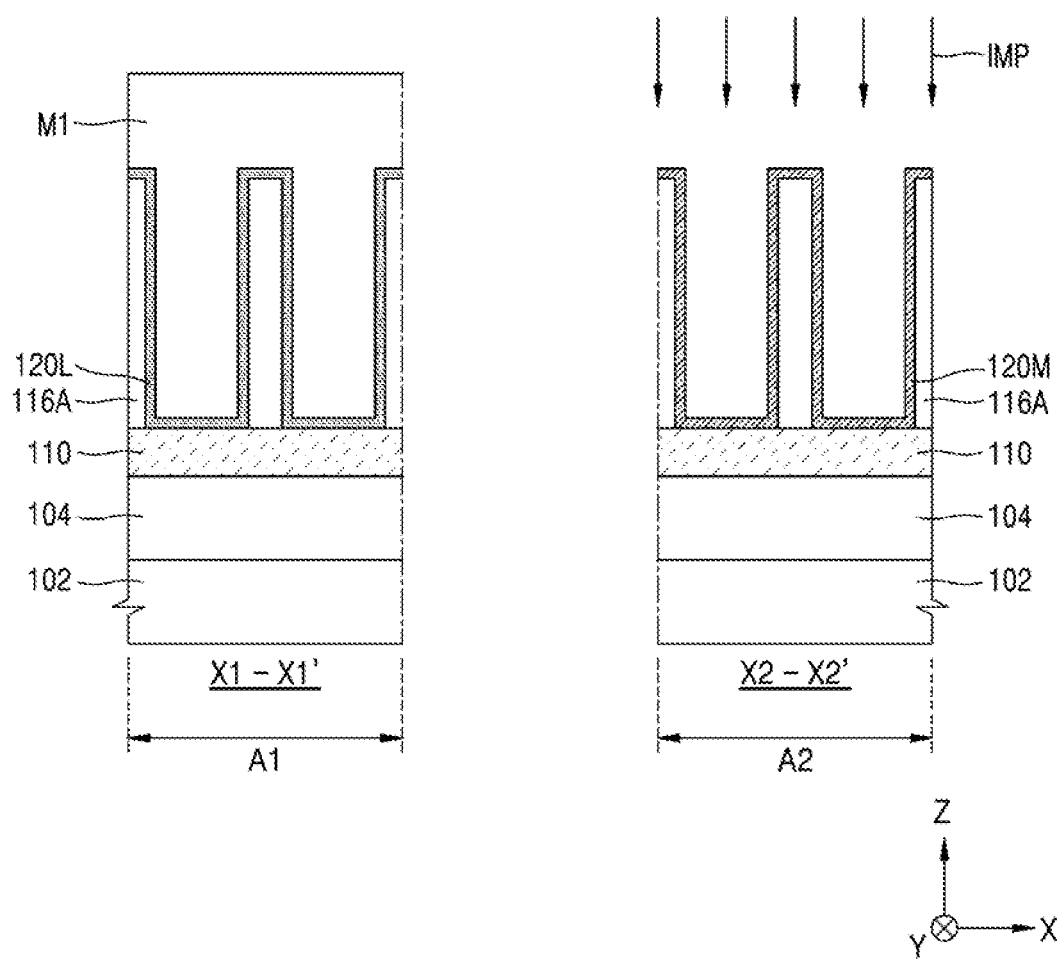

Referring to FIG. 14C, the first region A1 may be covered with a mask pattern M1, and in the second region A2, a compositionally-changed preliminary heating electrode layer 120M may be formed by using the mask pattern M1 as an ion injection mask and injecting an impurity IMP into the preliminary heating electrode layer 120L.

In exemplary embodiments of the inventive concept, the mask pattern M1 may have a photoresist pattern. In exemplary embodiments of the inventive concept, the impurity IMP may include a non-metallic element or a metalloid element. For example, the impurity IMP may include nitrogen atoms or silicon atoms.

Figure 14D:
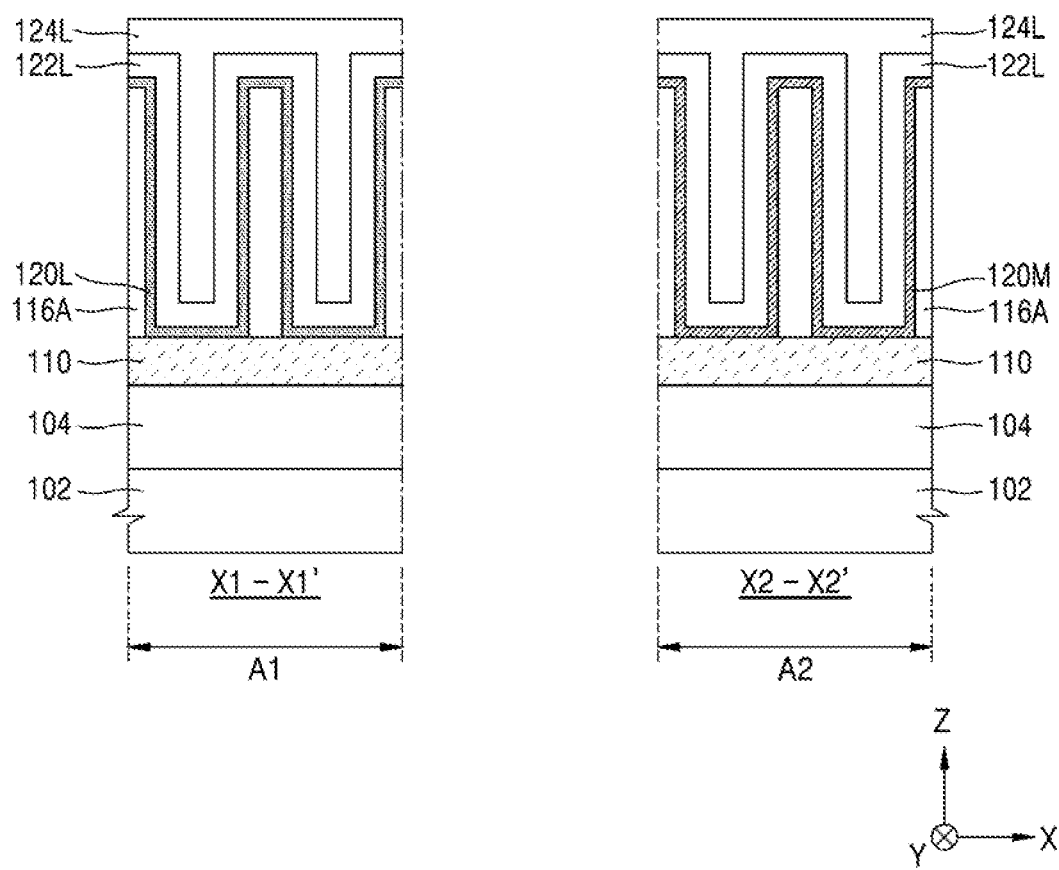

Referring to FIG. 14D, after the preliminary heating electrode layer 120L is exposed by removing the mask pattern M1 covering the first region A1 after performing the process of FIG. 14C, a first insulating spacer layer 122L and a preliminary gap fill insulating layer 124L may be formed on a resultant structure. The preliminary gap fill insulating layer 124L may fill spaces between the plurality of first insulating wall portions 116A on the first insulating spacer layer 122L. The constituent materials of the first insulating spacer layer 122L and the preliminary gap fill insulating layer 124L are the same as those of the first insulating spacer 122 and the gap fill insulating layer 124 described with reference to FIGS. 4A through 4C.

Figure 14E:
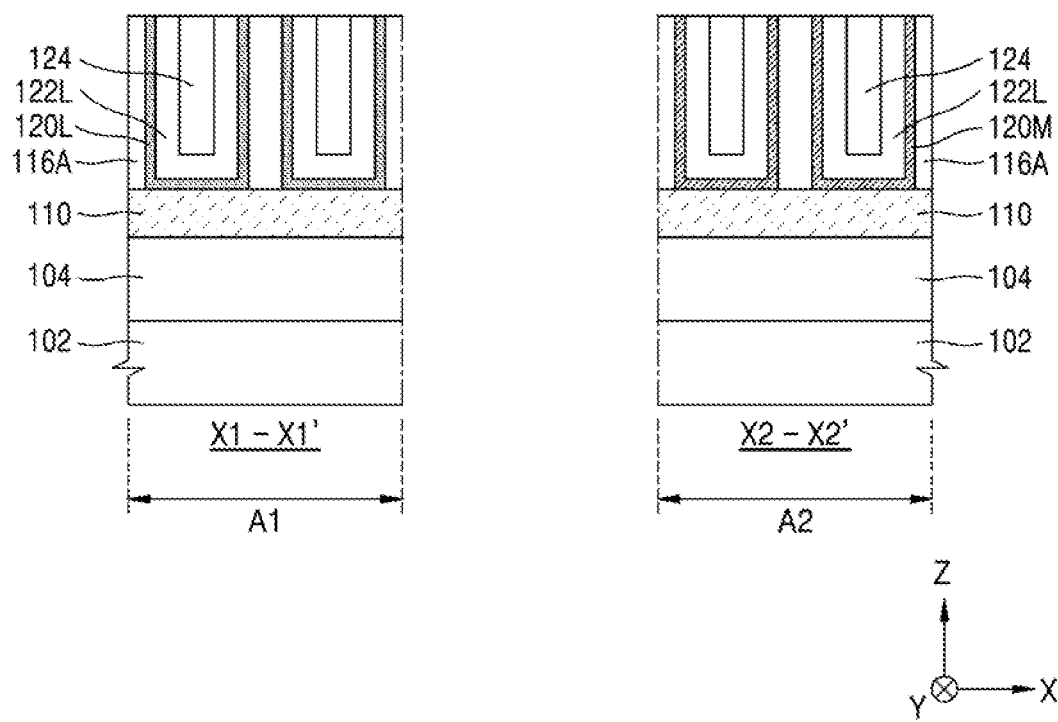

Referring to FIG. 14E, by removing portions of top surfaces of the plurality of first insulating wall portions 116A from the resultant structure of FIG. 14D to expose respective top surfaces of the plurality of first insulating wall portions 116A, the preliminary heating electrode layer 120L, the compositionally-changed preliminary heating electrode layer 120M, the first insulating spacer layer 122L, and the preliminary gap fill insulating layer 124L may be left between the plurality of first insulating wall portions 116A. While the aforementioned portions are removed, a thickness of each of the components arranged between the plurality of first insulating wall portions 116A and a thickness of the plurality of first insulating wall portions 116A may be reduced. In order to remove the aforementioned portions, a chemical mechanical polishing (CMP) process or an etchback process may be performed.

Next, a plurality of etching mask patterns may be formed on the resultant structure, and a structure exposed through the plurality of etching mask patterns may be etched to form the plurality of line-shaped stacked structures which include remaining portions of the first insulating wall portions 116A, the preliminary heating electrode layer 120L, the compositionally-changed preliminary heating electrode layer 120M, the first insulating spacer layer 122L, and the preliminary gap fill insulating layer 124L. The plurality of etching mask patterns may include a plurality of line patterns extending in parallel to each other in the X direction, like the plurality of first conductive lines 110. In exemplary embodiments of the inventive concept, the plurality of etching mask patterns may include polysilicon. Next, the plurality of second insulating wall portions 116B (refer to FIG. 4B) filling line-shaped spaces between the plurality of stacked structures may be formed, and then, the plurality of etching mask patterns may be removed. An insulating layer having a thickness sufficient to fill the line-shaped space between the plurality of stacked structures may be formed to form the plurality of second insulating wall portions 116B, and then, the portions of the insulating layer may be removed by the CMP or the etchback process. While the portions of the insulating layer are removed, heights of the plurality of first insulating wall portions 160A, the preliminary heating electrode layer 120L the compositionally-changed preliminary heating electrode layer 120M, the first insulating spacer layer 122L, and the preliminary gap fill insulating layer 124L may be further reduced. The preliminary gap fill insulating layer 124L with the height thereof reduced may remain as the gap fill insulating layer 124.

Figure 14F:
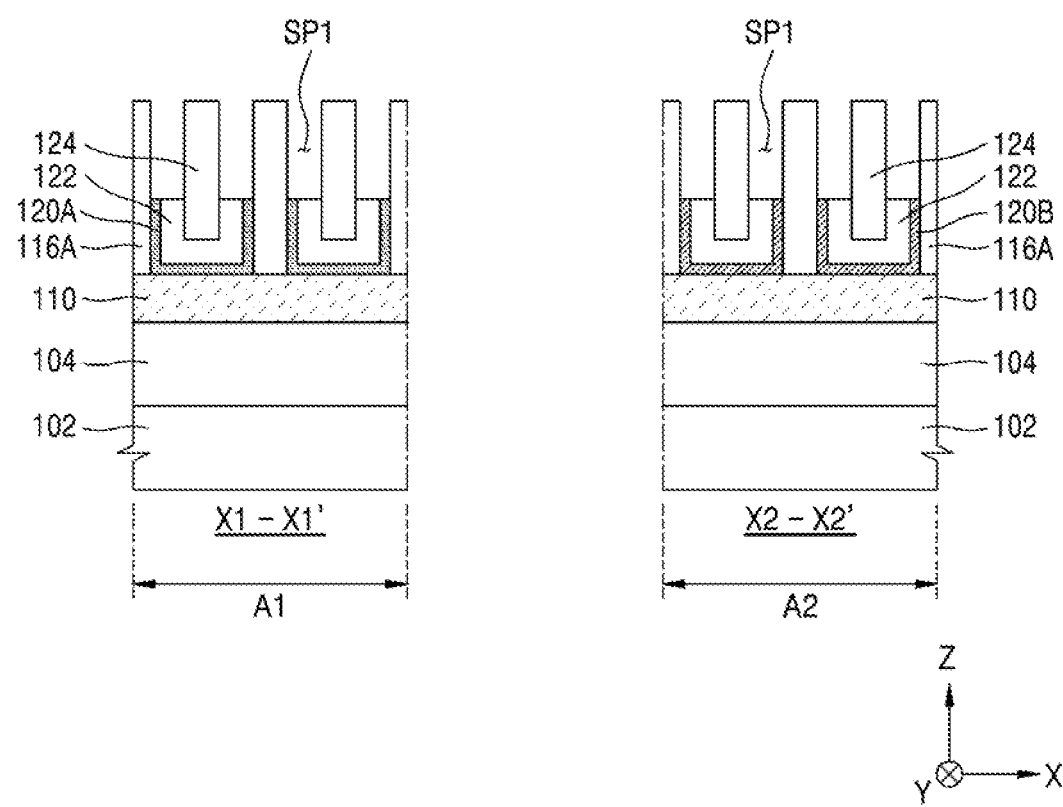

Referring to FIG. 14F, by selectively etching certain thicknesses from respective top surfaces of the first insulating spacer layer 122L, the preliminary heating electrode layer 120L, and the compositionally-changed preliminary heating electrode layer 120M in the resultant structure of FIG. 14E, the first insulating spacer 122 may be formed from the first insulating spacer layer 122L, and the first heating electrode layer 120A and the second heating electrode layer 120B may be formed from the preliminary heating electrode layer 120L and the compositionally-changed preliminary heating electrode layer 120M. On respective top surfaces of the first heating electrode layer 120A and the second heating electrode layer 120B, a plurality of spaces SP1 may remain which are disposed between the plurality of first insulating wall portions 116A or the plurality of second insulating wall portions 116B.

Figure 14G:
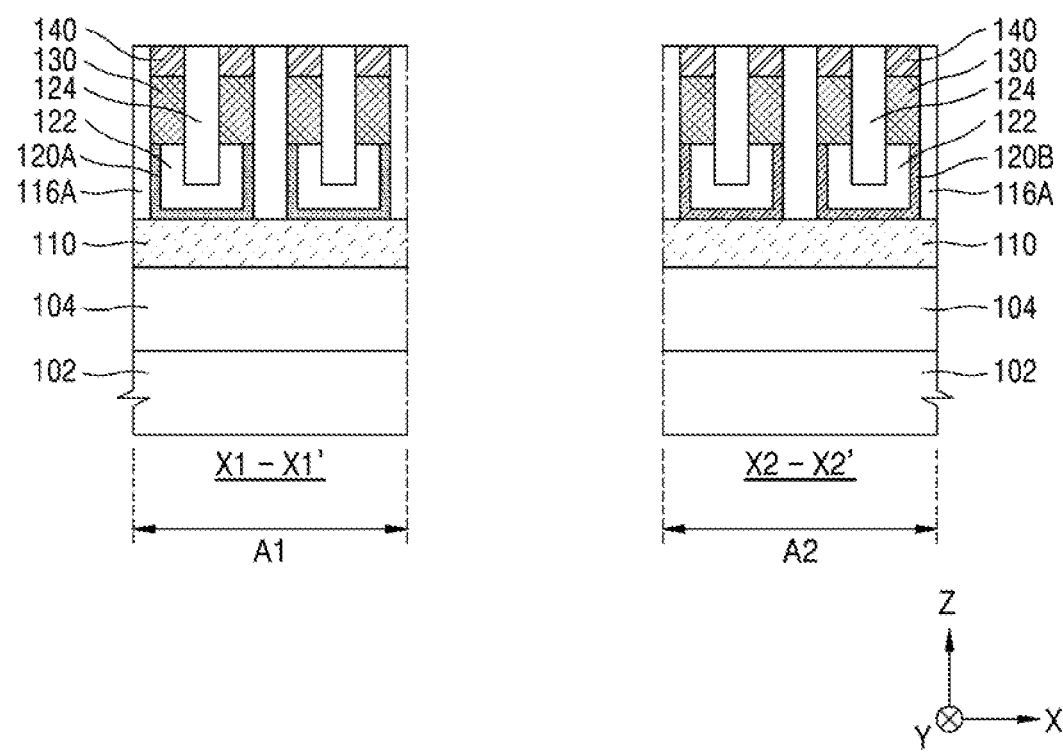

Referring to FIG. 14G, the resistive memory layer 130 and the electrode layer 140 respectively filling the space SP1 on the first heating electrode layer 120A and the second heating electrode layer 120B may be formed.

Figure 14H:
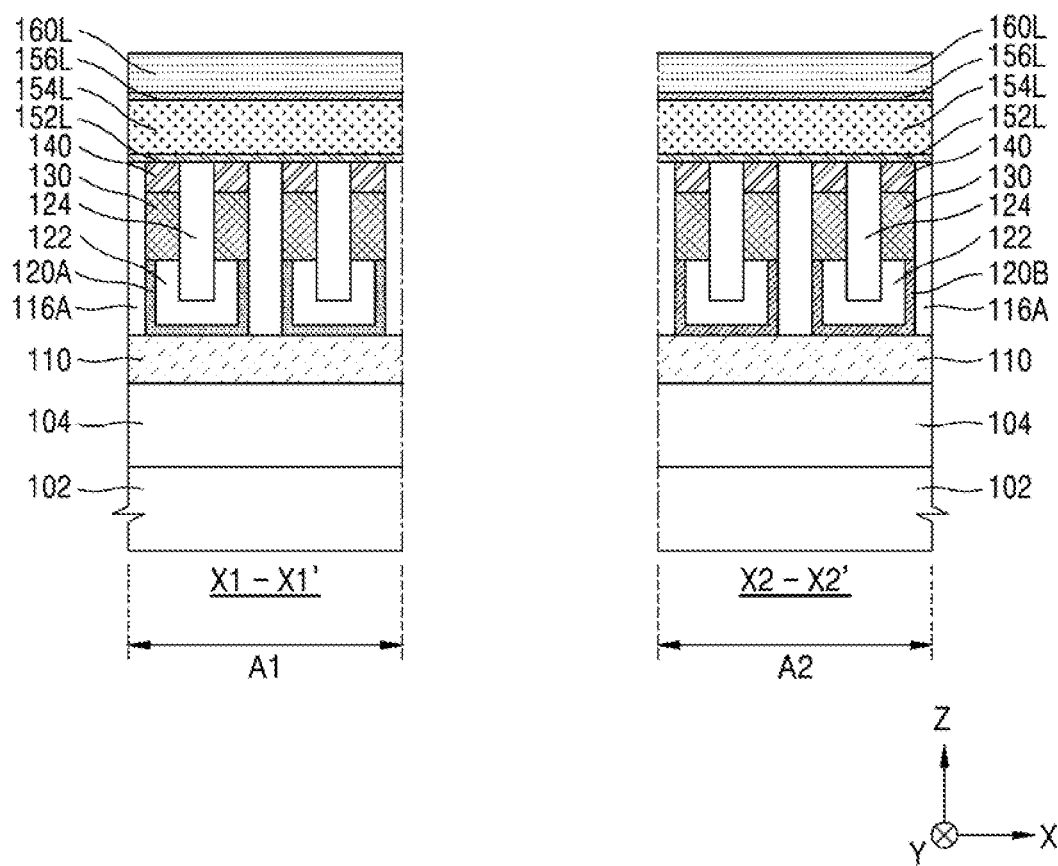

Referring to FIG. 14H, on a resultant structure in which the electrode layer 140 is formed, a preliminary first interface layer 152L, a preliminary selection device layer 154L, a preliminary second interface layer 156L, and a preliminary electrode layer 160L may be sequentially formed.

Figure 14I:
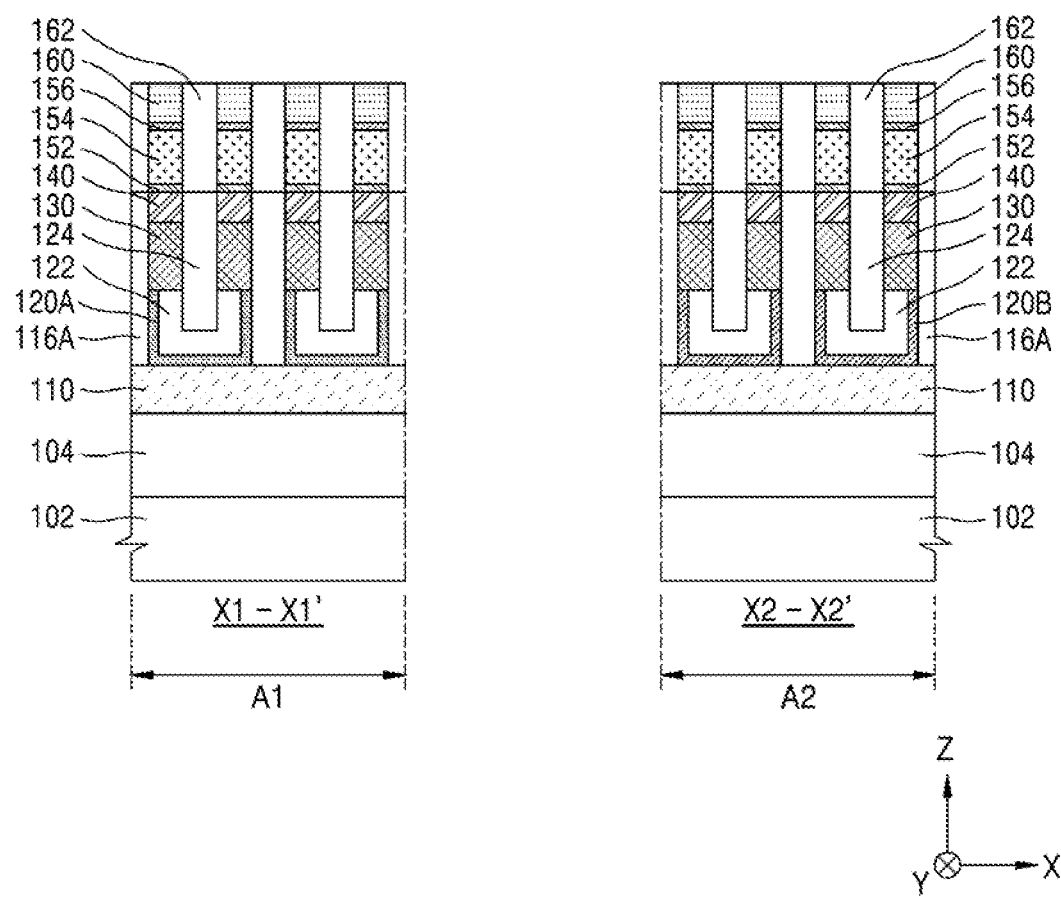

Referring to FIG. 14I, a plurality of stacked structures in which the first interface layer 152, the selection device layer 154, the second interface layer 156, and the electrode layer 160 are sequentially stacked may be formed by patterning the preliminary first interface layer 152L, the preliminary selection device layer 154L, the preliminary second interface layer 156L, and the preliminary electrode layer 160L, and then, an insulating layer 162 filling spaces between the plurality of stacked structures may be formed. The plurality of stacked structures may be arranged at respective positions corresponding to the plurality of memory cells MC (refer to FIG. 4A) on the plurality of electrode layers 140 in a matrix shape in a plan view.

Figure 14J:
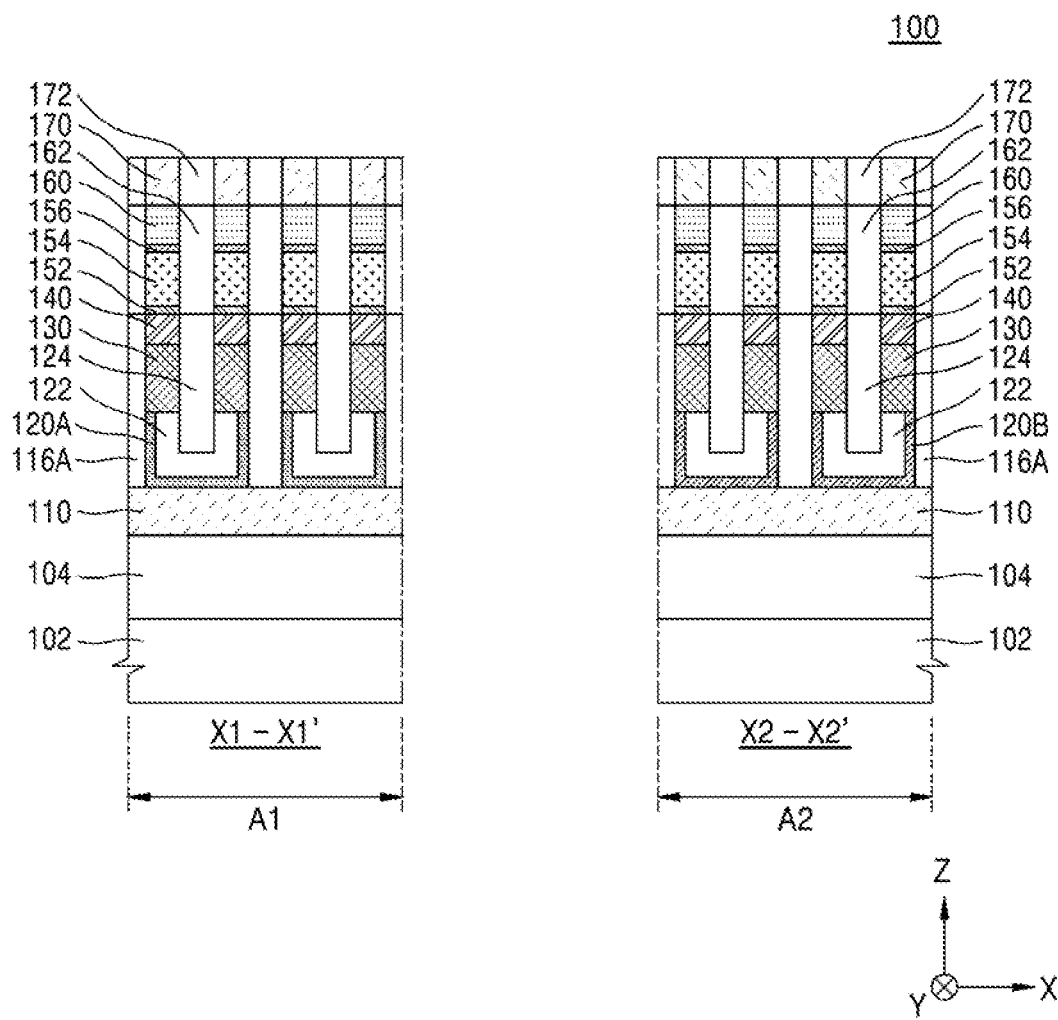

Referring to FIG. 14J, the memory device 100 may be formed by forming the plurality of second conductive lines 170 and the plurality of second insulating patterns 172 on the resultant structure of FIG. 14I.

The method of fabricating the memory device 100 illustrated in FIGS. 4A through 4C has been described with reference to FIGS. 14A through 14J. However, memory devices having structures of the memory devices 200, 300, and 400 illustrated in FIGS. 6 through 8 or various other structures which are within the scope of the inventive concept may be fabricated by using the fabricating process described with reference to FIGS. 14A through 14J or various other methods that are within the scope of the inventive concept.

For example, to fabricate the memory device 200 illustrated in FIG. 6, after the plurality of first conductive lines 110 and the plurality of first insulating patterns 112 are formed by the method described with reference to FIG. 14A, and before the plurality of first insulating wall portions 116A is formed, by performing the processes described with reference to FIGS. 14H and 14I, the plurality of stacked structures in which the first interface layer 152, the selection device layer 154, the second interface layer 156, and the electrode layer 160 are sequentially stacked directly on the plurality of first conductive lines 110 may be formed. The insulating layer 162 is also filled in the spaces between the plurality of stacked structures by these processes. Next, by performing the process of forming the plurality of first insulating wall portions 116A described with reference to FIG. 14A and the processes described with reference to FIGS. 14B through 14G, a structure may be formed which includes the first and second heating electrode layers 120A and 120B arranged in a space defined by the plurality of first insulating wall portions 116A and the plurality of second insulating wall portions 116B in the plurality of the stacked structures. The space in which the first and second heating electrode layers 120A and 120B are disposed may further be defined by the resistive memory layer 130, and the electrode layer 140. Next, by using the method described with reference to FIG. 14J, the plurality of second conductive lines 170 and the plurality of second insulating patterns 172 may be formed on the plurality of electrode layers 140.

To fabricate the memory device 300 illustrated in FIG. 7, after the process of forming the first insulating spacer layer 122L that covers the preliminary heating electrode layer 120L and the compositionally-changed preliminary heating electrode layer 120M is completed by using the method described with reference to FIGS. 14A through 14D, the etching process may be performed to separate each of the preliminary heating electrode layer 120L, the compositionally-changed preliminary heating electrode layer 120M, and the first insulating spacer layer 122L. Then, the preliminary gap fill insulating layer 124L may fill spaces between the preliminary heating electrode layer 120L and the first insulating spacer layer 122L, and spaces between the compositionally-changed preliminary heating electrode layer 120M and the first insulating spacer layer 122L. Next, other processes described with reference to FIGS. 14E through 14J may be performed.

To fabricate the memory device 400 illustrated in FIG. 8, the fabricating method of the memory device 200 illustrated in FIG. 6 and the fabricating method of the memory device 300 illustrated in FIG. 7 may be combined and applied.

FIGS. 15A through 15D are cross-sectional views illustrating a method of fabricating a memory device 500 according to exemplary embodiments of the inventive concept. An example fabricating method of the memory device 500 illustrated in FIG. 9 is described with reference to FIGS. 15A through 15D. FIGS. 15A through 15D illustrate components corresponding to the cross-sections taken along the X1-X1' line and the X2-X2' line in FIG. 4A according to a processing sequence.

Figure 15A:
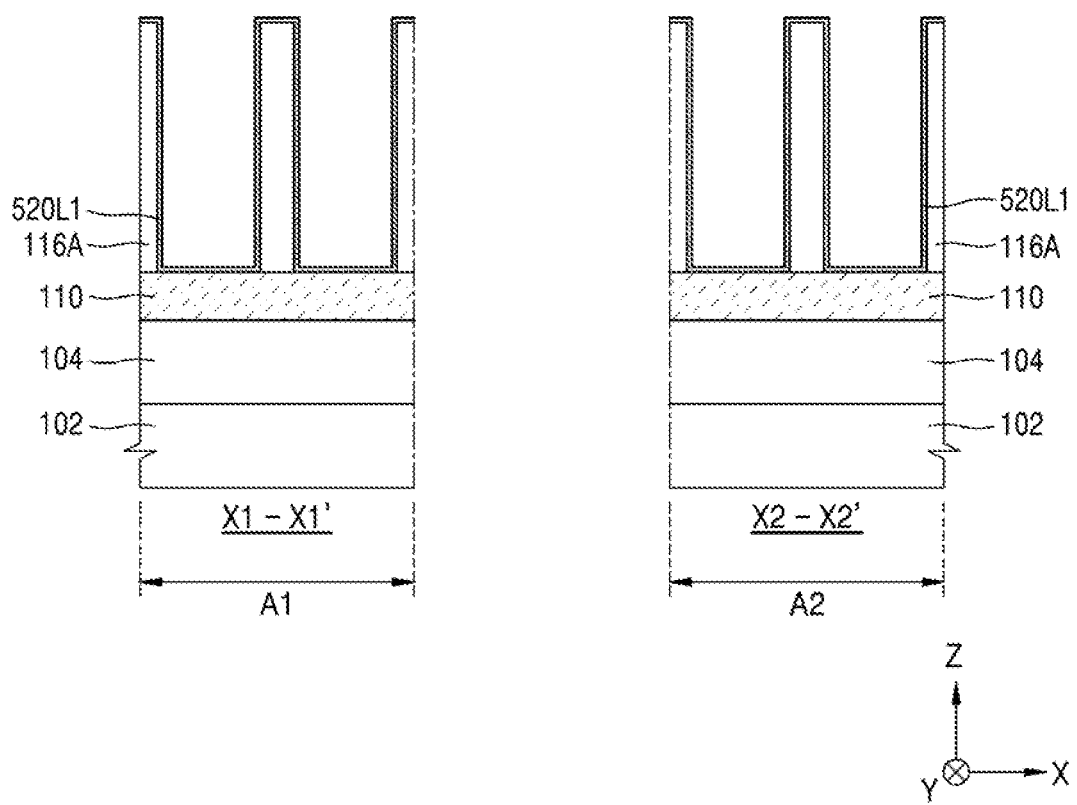
FIGS. 15A, 15B, 15C and 15D are cross-sectional views illustrating a method of fabricating a memory device according to exemplary embodiments of the inventive concept.

Referring to FIG. 15A, the interlayer insulating layer 104 may be formed on the substrate 102 by the method described with reference to FIG. 14A, the plurality of first conductive lines 110 and the plurality of first insulating patterns 112 (refer to FIG. 4B) insulating the plurality of first conductive lines 110 from each other, and the plurality of first insulating wall portions 116A may be formed. Then, in a method similar to the method described with reference to FIG. 14B, a first preliminary heating electrode layer 520L1 may be formed which conformally covers exposed surfaces of the plurality of first insulating wall portions 116A, the plurality of first conductive lines 110, and the plurality of first insulating patterns 112 (refer to FIG. 4B). A more detailed configuration of the first preliminary heating electrode layer 520L1 is substantially the same as that described for the preliminary heating electrode layer 120L with reference to FIG. 14B. However, a thickness of the first preliminary heating electrode layer 520L1 may be less than that required for the first heating electrode layer 520A (refer to FIG. 9) to be formed in the first region A1.

Figure 15B:
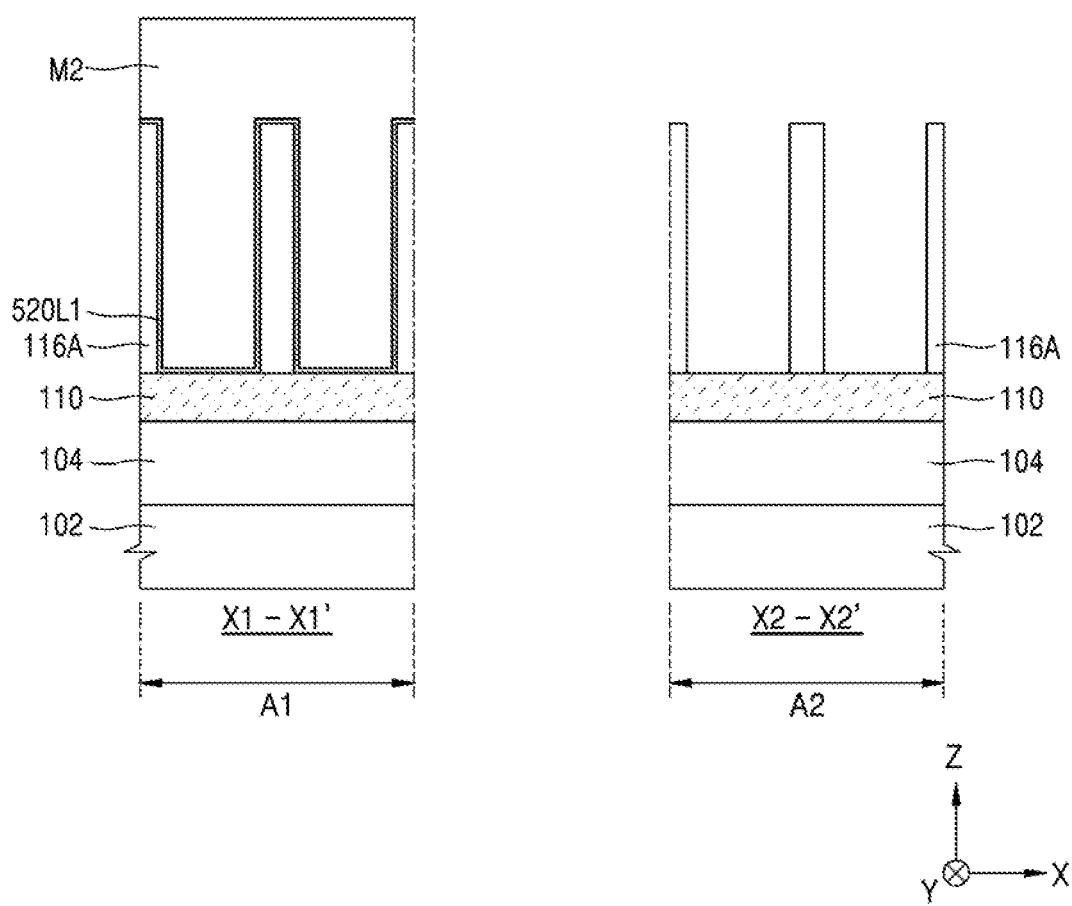

Referring to FIG. 15B, the first region A1 may be covered with a mask pattern M2, and the first preliminary heating electrode layer 520L1 may be removed from the second region A2 by using the mask pattern M2 as an etching mask. The mask pattern M2 may have a photoresist pattern. A wet etching process may be used to remove the first preliminary heating electrode layer 520L1 in the second region A2.

Figure 15C:
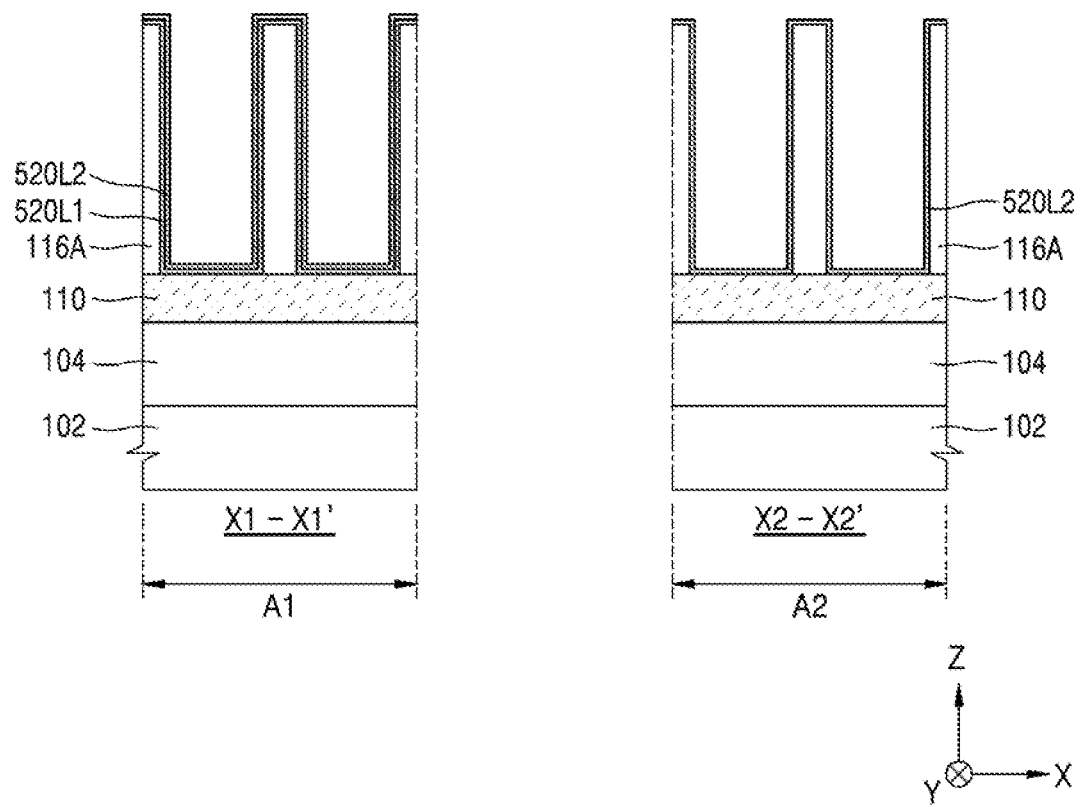

Referring to FIG. 15C, after the first preliminary heating electrode layer 520L1 is exposed in the first region A1 by removing the mask pattern M2 covering the first region A1 from the resultant structure of FIG. 15B, in a method similar to that described for the preliminary heating electrode layer 120L of FIG. 14B, a second preliminary heating electrode layer 520L2 may be formed in the first region A1 and the second region A2.

The second preliminary heating electrode layer 520L2 may be formed to conformally cover the first preliminary heating electrode layer 520L1 in the first region A1, and exposed surfaces of each of the plurality of first insulating wall portions 116A, the plurality of first conductive lines 110, and the plurality of first insulating patterns 112 (refer to FIG. 4B) in the second region A2. A more detailed configuration of the second preliminary heating electrode layer 520L2 is substantially the same as that described for the preliminary heating electrode layer 120L with reference to FIG. 14B. However, a thickness of the second preliminary heating electrode layer 520L2 in the first region A1 and the second region A2 may be less than that required for the first heating electrode layer 520A (refer to FIG. 9) to be formed in the first region A1. In the first region A1, a sum of the thickness of the first preliminary heating electrode layer 520L1 and the thickness of the second preliminary heating electrode layer 520L2 may be substantially the same as the thickness required for the first heating electrode layer 520A (refer to FIG. 9) to be firmed in the first region A1. The thickness of the second preliminary heating electrode layer 520L2 may be substantially the same as the thickness required for the second heating electrode layer 520B (refer to FIG. 9) to be formed in the second region A2.

Figure 15D:
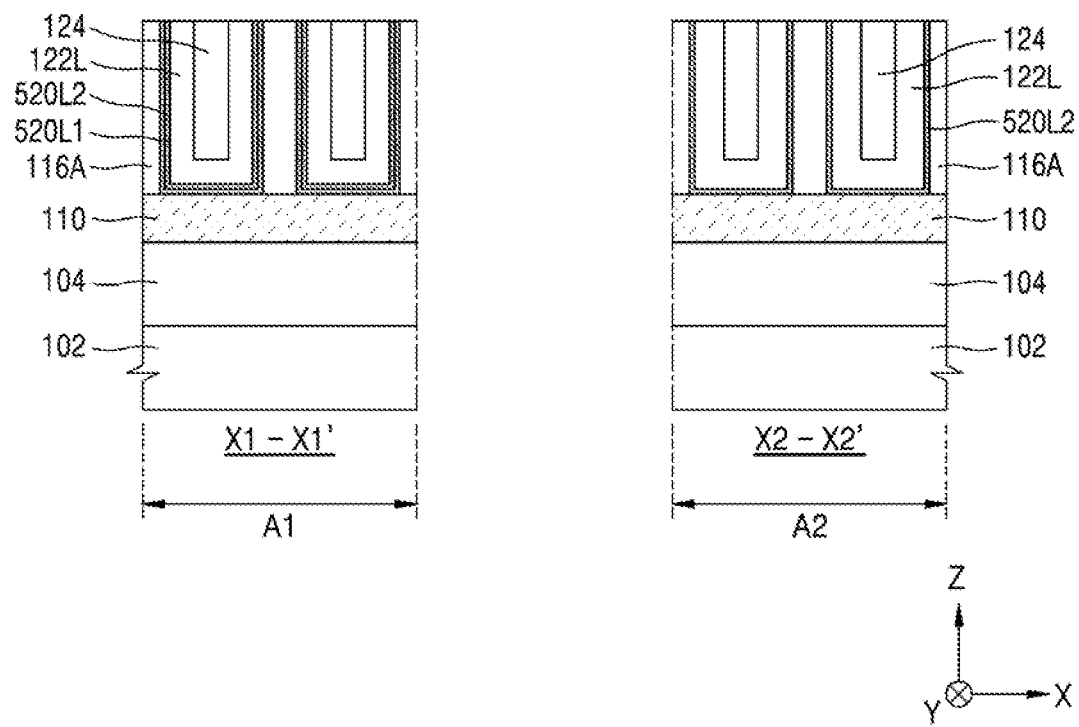

Referring to FIG. 15D, by performing the processes described with reference to FIG. 14D and FIG. 14E to the resultant structure of FIG. 15C, the first insulating spacer layer 122L and the gap fill insulating layer 124 which cover the second preliminary heating electrode layer 520L2 in the first region A1 and the second region A2 may be formed.

Next, the memory device 500 illustrated in FIG. 9 may be fabricated by performing processes described with reference to FIGS. 14F through 14J. Here, the first heating electrode layer 520A illustrated in FIG. 9 may be obtained from the first preliminary heating electrode layer 520L1 and the second preliminary heating electrode layer 520L2 which remain in the first region A1 of the resultant structure of FIG. 15D. In addition, the second heating electrode layer 520B illustrated in FIG. 9 may be obtained from the second preliminary heating electrode layer 520L2 remaining in the second region A2 of the resultant structure of FIG. 15D.

To fabricate the memory devices 600, 700, and 800 illustrated in FIGS. 11 through 13, the processes described with reference to FIGS. 15A through 15D, the processes described with reference to FIGS. 14A through 14J, and methods combining the above-described methods of fabricating the memory devices 200, 300, and 400 illustrated in FIGS. 6 through 8 may be used.

A resistive memory device according to an exemplary embodiment of the inventive concept may increase a heating power by providing a large contact resistance in the heating electrode layer arranged in a region where a distance from an access point to which is voltage is applied is relatively large, even though a voltage drop caused by an IR drop occurs in the region where the distance from the access point is relatively large. Thus, it is possible to compensate for an efficiency drop due to the voltage drop caused by the IR drop and prevent an operation margin reduction in the region where the distance from the access point is relatively large. Accordingly, the reliability of the memory device may be increased, and a higher speed and a larger capacity of the memory device may be obtained.

While the present inventive concept has been particularly shown and described with reference to exemplary embodiments thereof, the present inventive concept is not limited thereto, and various changes and modifications may be made by those of ordinary skill in the art without departing from the spirit and scope of the present inventive concept as defined by the following claims.

What is claimed is:

1. A resistive memory device, comprising:
a plurality of first conductive lines extending in a first direction;
a plurality of second conductive lines extending in a second direction crossing the first direction; and
a plurality of memory cells connected to the plurality of first conductive lines and the plurality of second conductive lines,
wherein the plurality of memory cells comprise:
a first memory cell comprising a first resistive memory layer and a first heating electrode layer, the first heating electrode layer comprises a first contact surface in contact with the first resistive memory layer and the first contact surface has a first contact resistance; and
a second memory cell comprising a second resistive memory layer and a second heating electrode layer, the second heating electrode layer comprises a second contact surface in contact with the second resistive memory layer and the second contact surface has a second contact resistance different from the first contact resistance, wherein at least one of the first heating electrode layer and the second heating electrode layer has a u-shape in a cross-sectional view, and wherein the at least one of the first heating electrode layer and the second heating electrode layer contacts a third memory cell of the plurality of memory cells.

2. The resistive memory device of claim 1, wherein an area of the first contact surface is different from an area of the second contact surface.

3. The resistive memory device of claim 1, wherein a composition of the first heating electrode layer is different from a composition of the second heating electrode layer.

4. The resistive memory device of claim 1, wherein the first heating electrode layer comprises a material having a first resistivity, and the second heating electrode layer comprises a material having a second resistivity different from the first resistivity.

5. The resistive memory device of claim 1, further comprising a driver configured to apply a voltage to an access point of each of the plurality of first conductive lines, wherein a first current path from the access point to the first memory cell and a second current path from the access point to the second memory cell have different lengths from each other.

6. The resistive memory device of claim 5, wherein the second current path is longer than the first current path, and a thickness of the second heating electrode layer is less than a thickness of the first heating electrode layer.

7. The resistive memory device of claim 5, wherein the second current path is longer than the first current path, and an area of the second contact surface is less than an area of the first contact surface.

8. The resistive memory device of claim 5, wherein the second current path is longer than the first current path, and a resistivity of the second heating electrode layer is greater than a resistivity of the first heating electrode layer.

9. The resistive memory device of claim 5, wherein the second current path is longer than the first current path, the first heating electrode layer and the second heating electrode layer each comprises a first metal, and a content ratio of the first metal in the second heating electrode layer is less than a content ratio of the first metal in the first heating electrode layer.

10. The resistive memory device of claim 5, wherein the second current path is longer than the first current path, the first heating electrode layer and the second heating electrode layer each comprises nitrogen atoms, and a content ratio of the nitrogen atoms in the second heating electrode layer is greater than a content ratio of the nitrogen atoms in the first heating electrode layer.

11. The resistive memory device of claim 5, wherein the second current path is longer than the first current path, the first heating electrode layer and the second heating electrode layer each comprises silicon atoms, and a content ratio of the silicon atoms in the second heating electrode layer is greater than a content ratio of the silicon atoms in the first heating electrode layer.

12. A resistive memory device, comprising:
a first conductive line comprising an access point to which a voltage is applied; and
a plurality of memory cells connected to the first conductive line,
wherein the plurality of memory cells comprise:
a first memory cell arranged at a first distance from the access point, the first memory cell comprising a first resistive memory layer and a first heating electrode layer, the first heating electrode layer comprises a first contact surface in contact with the first resistive memory layer and the first contact surface has a first contact resistance; and
a second memory cell arranged at a second distance greater than the first distance from the access point, the second memory cell comprising a second resistive memory layer and a second heating electrode layer, the second heating electrode layer comprises a second contact surface in contact with the second resistive memory layer and the second contact surface has a second contact resistance different from the first contact resistance, wherein at least one of the first heating electrode layer and the second heating electrode layer has a u-shape in a cross-sectional view, and wherein the at least one of the first heating electrode layer and the second heating electrode layer contacts a third memory cell of the plurality of memory cells.

13. The resistive memory device of claim 12, wherein a resistivity of the second heating electrode layer is greater than a resistivity of the first heating electrode layer.

14. The resistive memory device of claim 12, wherein a content ratio of at least one element selected among a non-metallic element and a metalloid element in the second heating electrode layer is greater than a content ratio of the at least one element in the first heating electrode layer.

15. The resistive memory of claim 12, wherein an area of the second contact surface is less than an area of the first contact surface.

16. A resistive memory device, comprising:
a plurality of first conductive lines extending in a first direction in a first region and a second region, the first region and the second region being spaced apart from each other on a substrate;
a plurality of second conductive lines extending in a second direction in the first region and the second region, the second direction crossing the first direction; and
a plurality of memory cells connected to the first conductive lines and the second conductive lines in the first region and the second region,
wherein the plurality of memory cells comprise:
a first memory cell comprising a first heating electrode layer arranged in the first region and having a first resistance; and
a second memory cell comprising a second heating electrode layer arranged in the second region and having a second resistance greater than the first resistance,
wherein the plurality of memory cells comprise a pair of first memory cells arranged in the first region and configured to share the first heating electrode layer, and a pair of second memory cells arranged in the second region and configured to share the second heating electrode layer.

17. The resistive memory device of claim 16, wherein one conductive line among the plurality of first conductive lines comprises an access point to which a voltage is applied, and a distance from the access point to the second heating electrode layer is greater than a distance from the access point to the first heating electrode layer.

18. The resistive memory device of claim 16, wherein a content ratio of at least one element selected among a non-metallic element and a metalloid element in the second heating electrode layer is greater than a content ratio of the at least one element in the first heating electrode layer.

19. The resistive memory device of claim 16, wherein the first heating electrode layer comprises a first pin portion extending in a direction away from the substrate, the second heating electrode layer comprises a second pin portion extending in a direction away from the substrate, and a thickness of the second pin portion is less than a thickness of the first pin portion.

* * * * *